(12) United States Patent
Gustafsson et al.

(10) Patent No.: US 9,035,647 B2
(45) Date of Patent: May 19, 2015

(54) ENCODER

(71) Applicant: LEINE & LINDE AB, Straengnaes (SE)

(72) Inventors: Fredrik Gustafsson, Straengnaes (SE); Lars Peter Johan Kjellqvist, Moelnbo (SE)

(73) Assignee: LEINE & LINDE AB, Straengnae (SE)

( * ) Notice: Subject to any disclaimer, the term of this patent is extended or adjusted under 35 U.S.C. 154(b) by 143 days.

(21) Appl. No.: 13/827,268

(22) Filed: Mar. 14, 2013

(65) Prior Publication Data

US 2014/0002065 A1 Jan. 2, 2014

Related U.S. Application Data

(60) Provisional application No. 61/713,801, filed on Oct. 15, 2012.

(30) Foreign Application Priority Data

Jul. 2, 2012 (SE) ....................................... 1200406

(51) Int. Cl.
| | |
|---|---|
| G01D 5/244 | (2006.01) |
| G01B 7/30 | (2006.01) |
| G01D 5/14 | (2006.01) |
| G01D 5/20 | (2006.01) |

(52) U.S. Cl.
CPC ................ *G01D 5/244* (2013.01); *G01D 5/145* (2013.01); *G01D 5/2073* (2013.01)

(58) Field of Classification Search
CPC ............ G01B 7/30; G01B 7/14; G01B 11/02; G01B 11/14
USPC .......................... 324/207.13–207.25, 173–174
See application file for complete search history.

(56) References Cited

U.S. PATENT DOCUMENTS

2010/0207617 A1* 8/2010 Novak et al. ............. 324/207.25

FOREIGN PATENT DOCUMENTS

DE 198 13 375 9/1999

OTHER PUBLICATIONS

European Search Report, dated Sep. 13, 2013, issued in corresponding European Patent Application No. 13174535.8.

\* cited by examiner

*Primary Examiner* — Arleen M Vazquez
*Assistant Examiner* — Neel Shah
(74) *Attorney, Agent, or Firm* — Kenyon & Kenyon LLP

(57) ABSTRACT

An encoder is configured for detection of rotational movement of a rotatable shaft in relation to a part of a machine, and a method is provided for generating a reference signal by an encoder.

18 Claims, 23 Drawing Sheets

ENCODER

CROSS-REFERENCE TO RELATED APPLICATIONS

The present application claims priority to Application No. 1200406-5, filed in the Kingdom of Sweden on Jul. 2, 2012, which is expressly incorporated herein in its entirety by reference thereto.

The present application claims the benefit of U.S. Provisional Patent Application No. 61/713,801, filed on Oct. 15, 2012, which is expressly incorporated herein in its entirety by reference thereto.

FIELD OF THE INVENTION

The present invention relates to an encoder apparatus. The present invention also relates to a method of operating such an encoder apparatus, and to a computer program product for causing an encoder to execute functions.

BACKGROUND INFORMATION

In many industrial applications there is a need to monitor the movement of a movable part. Such monitoring requires the delivery of an encoder output signal indicative of the movement, or indicative of the position of the movable part.

It is conventional to provide an encoder apparatus in which the encoder output signal is generated in dependence on a detected magnetic field. A magnetic encoder may include a magnetic scale that can be installed on a rotatable shaft of a machine. U.S. Patent Application Publication No. 2010/0207617 describes an incremental encoder for detection of the movement of a shaft including a scale having a series of spaced magnetic marks mounted on the circumference of the shaft. A read head is mounted on another machine part so as to pass along the scale, the read head including a first set of detectors 16-1 for sensing the scale marks, and generating a pulsed signal in response to rotational movement of the shaft and scale in relation to the read head. In order to be able to generate an encoder output signal indicating not only incremental movement of the shaft, but also providing a position output signal, a counter is used for counting the pulses of the pulsed signal, the counter value being indicative of the position. In order for the counter value to reflect the position of the shaft within a single revolution, it is conventional to provide the magnetic scale with a magnetic reference marker. In this manner, the reference marker is used for generating a reference signal once per shaft revolution in response to the magnetic reference marker passing a separate second set of reference sensors 16-2 provided in the read head, as described in U.S. Patent Application Publication No. 2010/0207617. Providing a separate reference marker next to the scale requires additional space, which may not be available, as pointed out in U.S. Patent Application Publication No. 2010/0207617. To address this problem, U.S. Patent Application Publication No. 2010/0207617 describes providing the reference mark by further magnetizing the scale in a region of one of the existing pole pitches so as to produce a reference signal. The further magnetization extends across only a part of the width of the scale, covering less than half of the width, so that the incremental signals may be read undisturbed, according to U.S. Patent Application Publication No. 2010/0207617.

SUMMARY

Example embodiments of the present invention provide an improved encoder system.

According to an example embodiment of the present invention, an encoder, for detection of rotational movement of a rotatable shaft in relation to a part of a machine, includes a scale device for attachment to a circumference of the shaft, and the scale device having a width and a length. The scale device includes a first magnetic scale pattern including a plurality of magnetic pole elements provided with a first predetermined division in the direction of the length so as to generate a first magnetic field pattern at a first distance from a surface of the scale device. A signal generator is provided for mounting on the machine part, the signal generator including a housing. The signal generator also includes a first output terminal suitable for providing an encoder output signal indicative of a relative change in position between the signal generator and the scale device. The signal generator includes a second output terminal suitable for providing a reference signal indicative of a rotational position of the shaft. The signal generator further includes a first magneto-electric transducer head having a first magneto-electric transducer adapted to generate a first electric signal in response to detection of the magnetic field pattern so that the first electric signal varies periodically in dependence on the first magnetic field pattern such that the variation exhibits a first wavelength, which depends on the first predetermined division when the first magneto-electric transducer moves along the first magnetic scale pattern. The signal generator also includes a second magneto-electric transducer head having a second magneto-electric transducer adapted to generate a second electric signal in response to detection of the first magnetic field pattern so that the second electric signal varies periodically in dependence on the first magnetic field pattern such that the variation exhibits the first wavelength dependent on the first predetermined division when the second magneto-electric transducer moves along the first magnetic scale pattern. The signal generator also includes a first signal processing unit, which includes: a first device adapted to generate a periodically varying first digital signal in dependence on the first electric signal such that the variation of the first digital signal exhibits the first wavelength when the first magneto-electric transducer moves along the first magnetic scale pattern; and a second device adapted to generate a periodically varying second digital signal in dependence on the second electric signal such that the variation of the second digital signal exhibits the first wavelength when the second magneto-electric transducer moves along the first magnetic scale pattern. The scale device includes at least one gap between ends of the first magnetic scale pattern. The signal generator further includes an analyzer adapted to generate a scale gap indicator signal in dependence on an analysis involving the first digital signal, or an analysis involving the second digital signal and/or a comparative analysis involving the first digital signal and the second digital signal. Moreover, the signal generator includes an output signal producer adapted to produce the encoder output signal in dependence on the first digital signal and the second digital signal, and the output signal producer is adapted to produce the reference signal in dependence on the scale gap indicator signal.

This arrangement provides for a reference signal at least once per revolution of the rotatable shaft, while eliminating the need to make the scale so wide as to allow for the provision of a separate magnetic reference mark. Hence, whereas U.S. Patent Application Publication No. 2010/0207617 describes to reserve almost half of the width of the scale for a separate magnetic reference mark, which would appear to require a rather wide scale when also requiring the first set of detectors 16-1 to read the incremental signals undisturbed from the other half of the width, the width of the scale device described herein may be made narrower. The encoder output signal may be an incremental signal which is indicative of a change in position. The encoder output signal may also be indicative of a rotational position of the shaft 20.

Moreover, the housing of the signal generator may also be made small with respect to the physical extension in the direction parallel to the axis of rotation of the shaft, since, in contrast to the U.S. Patent Application Publication No. 2010/0207617, this eliminates the need for a separate second set of reference sensors positioned so as to read the magnetic reference marker from one half of the scale width while allowing the first set of detectors to read the incremental signals undisturbed from the other half of the scale width.

Moreover, it is noted that large shafts, such as, e.g. shafts having a diameter of 50 cm or more, may have an axial play, i.e., the shaft may inadvertently move during operation, in a direction parallel to the axis of shaft rotation, which also is the direction of the width of the scale device. If such movement occurs, the position of the magneto-electric transducer head may also be shifted in relation to the width of the scale. The arrangement described herein allows for mounting of the signal generator including the magneto-electric transducer head on the machine part, so as to allow the axial play to move the scale device a distance substantially equal to half the width of the scale device, while maintaining magneto electric detection, when the signal generator has been mounted at an optimum position.

The fact that the magnetic scale pattern generates a magnetic field pattern at a first distance from a surface of the scale device, in combination with the ability of the magneto-electric transducers to generate electric signals in response to detection of the magnetic field pattern may render a non-contact detection. In effect, no movable part of the encoder is in physical contact with any other part of the encoder, thereby, e.g., rendering an encoder which is free from mechanical wear. Hence, the configuration described herein may provide an encoder having a very long, or even unlimited, service life. The longevity feature of this non-contact detection is particularly advantageous in connection with the use of the encoder in machines which are difficult or cumbersome to maintain, such as a wind power station. In a wind power station, the encoder may be mounted to detect the movement of the rotating shaft at the high altitude of a wind power tower, making it difficult for maintenance personnel to reach the encoder for maintenance purposes.

According to example embodiments, the scale device 30 may be made of a flexible band, such as, e.g., a bendable steel band, provided with an openable locking device so as to allow the flexible band to be opened such that it may be placed at a desired measuring path position on the shaft. When positioned at the desired measuring path position on the shaft, the locking device of the flexible scale band may be closed and locked so as to attach it to the desired measuring path position on the shaft. The locking device may then be used as the gap portion of the scale device.

According to example embodiments, the scale device may include a dividable scale ring. The inner diameter of the dividable ring may substantially correspond to the outer diameter of a shaft to which the dividable scale ring is intended to be attached. The dividable scale ring may then have at least two openings so as to allow the ring to be divided in at least two parts. Hence, an opening of the dividable scale ring may be provided with an openable locking device so as to allow the dividable scale ring to be opened such that it may be placed at a desired measuring path position on the shaft. When positioned at the desired measuring path position on the shaft, the locking device of the dividable scale ring may be closed and locked so as to attach it to the desired measuring path position on the shaft. The locking device may then be used as the gap portion of the scale device.

According to example embodiments of the present invention, an encoder, for detection of rotational movement of a rotatable shaft in relation to a part of a machine, includes a scale device for attachment to a circumference of the shaft, the scale device having a width and a measuring path length. The scale device includes a first magnetic scale pattern including a plurality of magnetic pole elements provided with a first predetermined division in the direction of the length so as to generate a first magnetic field pattern at a first distance from a surface of the scale device. A signal generator is provided for mounting on the machine part, the signal generator including a housing. The signal generator further includes a first output terminal for providing an encoder output signal indicative of a relative change in position between the signal generator and the scale device, and a second output terminal. The signal generator includes a first magneto-electric transducer head having a first magneto-electric transducer adapted to generate a first electric signal in response to detection of the first magnetic field pattern so that the first electric signal varies periodically in dependence on the first magnetic field pattern such that the variation exhibits a first wavelength, which depends on the first predetermined division when the first magneto-electric transducer moves along the first magnetic scale pattern. The signal generator also includes a second magneto-electric transducer head having a second magneto-electric transducer adapted to generate a second electric signal in response to detection of the first magnetic field pattern so that the second electric signal varies periodically in dependence on the first magnetic field pattern such that the variation exhibits the first wavelength dependent on the first predetermined division when the second magneto-electric transducer moves along the first magnetic scale pattern. The signal generator further includes a first signal processing unit including: a first device adapted to generate a periodically varying first digital signal in dependence on the first electric signal such that the variation of the first digital signal exhibits the first wavelength when the first magneto-electric transducer moves along the first magnetic scale pattern; and a second device adapted to generate a periodically varying second digital signal in dependence on the second electric signal such that the variation of the second digital signal exhibits the first wavelength when the second magneto-electric transducer moves along the first magnetic scale pattern. The scale device includes at least one gap between ends of the first magnetic scale pattern. The signal generator moreover includes an analyzer adapted to generate a scale gap indicator signal in dependence on an analysis involving the first digital signal, or an analysis involving the second digital signal and/or a comparative analysis involving the first digital signal and the second digital signal. Still further, the signal generator includes an output signal producer adapted to produce the encoder output signal in dependence on the first digital signal the second digital signal, and the scale gap indicator signal.

This arrangement may provide a scale gap indicator signal, thereby providing an absolute position signal which can be reset, e.g., once per shaft revolution, in dependence on the scale gap indicator signal, while eliminating the need to make the scale so wide as to allow for the provision of a separate magnetic reference mark. Hence, this arrangement allows for the provision of an absolute position signal output, using the provision of a gap in the scale pattern, to achieve the advantages mentioned above in connection with the example embodiment that also provides a reference signal.

The scale device may be adapted for attachment on a shaft having a diameter of more than 50 cm.

The first magneto-electric transducer head may be arranged at a predetermined distance from the second magneto-electric transducer head, within the signal generator housing, such that the signal generator is mountable so that, in operation, at least one of the first and second magneto-electric transducer heads will be positioned so as to detect the first magnetic field pattern.

The gap may include at least a portion of the measuring path length lacking the first magnetic scale pattern.

The gap may have a gap width, which is dependent on a distance between the ends of the first magnetic scale pattern.

The predetermined distance between the first magneto-electric transducer head and the second magneto-electric transducer head may be longer than the sum of the gap width and at least one first predetermined division, in the case that the first and second magneto-electric transducer heads are magneto-resistive transducer heads.

The predetermined distance between the first magneto-electric transducer head and the second magneto-electric transducer head may be longer than the sum of the gap width and at least two first predetermined divisions, in the case that the first and second magneto-electric transducer heads are Hall sensor transducer heads.

The configuration described herein may ensure that there is a transition period covering a distance of at least one wave length for switching from relying on the latter transducer head to relying on the foremost transducer head in connection with a gap cross-over. Hence, this configuration allows for both of the latter transducer head and the foremost transducer head to simultaneously detect at least one full electric signal wave length, i.e., a first predetermined wavelength $\lambda_1$, after the foremost transducer head having crossed the gap, and before the output signal is switched over to be generated in dependence on the foremost transducer head.

The first magneto-electric transducer head may include a first lagged magneto-electric transducer adapted to generate a first lagged electric signal in response to detection of the magnetic field pattern so that said first lagged electric signal varies periodically in dependence on the magnetic field pattern such that the variation exhibits the first wavelength which depends on the first predetermined division when the first lagged magneto-electric transducer moves along the magnetic scale pattern. The first lagged magneto-electric transducer is positioned in relation to the first transducer such that, in operation, the first lagged electric signal varies at a first lag in relation to the first electric signal when the shaft rotates in a clockwise rotational direction, and such that the first lagged electric signal varies at a second lag in relation to the first electric signal when the shaft rotates in a counterclockwise rotational direction, the second lag being different from the first lag.

The second magneto-electric transducer head may include a second lagged magneto-electric transducer adapted to generate a second lagged electric signal in response to detection of the magnetic field pattern so that the second lagged electric signal varies periodically in dependence on the magnetic field pattern such that the variation exhibits the first wavelength which depends on the first predetermined division when the second lagged magneto-electric transducer moves along the magnetic scale pattern. The second lagged magneto-electric transducer is positioned in relation to the second transducer such that, in operation, the second lagged electric signal varies at a first lag in relation to the second electric signal when the shaft rotates in a clockwise rotational direction, and such that the second lagged electric signal varies at a second lag in relation to the second electric signal when the shaft rotates in a counterclockwise rotational direction.

The first lag may substantially correspond to a quarter of the first wavelength, and the second lag may substantially correspond to three quarters of the first wavelength.

The first lagged magneto-electric transducer and the first magneto-electric transducer may be Magneto-Resistive Transducers, and one first wavelength may be generated by the distance of one first predetermined division.

The first lagged magneto-electric transducer, having a direction of sensitivity, may be positioned at a geometrical distance from the first magneto-electric transducer, also having a direction of sensitivity. The first magneto-electric transducer and said first lagged magneto-electric transducer may be arranged such that their respective directions of sensitivity are substantially parallel, and the first lag may depend on the geometrical distance.

The geometrical distance may be a quarter of the first predetermined division.

The configuration described herein may render the first lag to become a quarter wavelength when the magneto-electric transducers are magneto-resistive transducers.

The first lagged magneto-electric transducer, having a direction of sensitivity, may be positioned in geometrical proximity to the first magneto-electric transducer, also having a direction of sensitivity. The first magneto-electric transducer and the first lagged magneto-electric transducer may be arranged such that there is a geometrical angle between their respective directions of sensitivity, and the first lag may depend on the geometrical angle.

The configuration described herein may render the first lag to be independent of the first predetermined division of the scale device. Hence, the first magneto-electric transducer head having the first magneto-electric transducer and the first lagged magneto-electric transducer may be used together with different scale devices having mutually different first predetermined divisions. Likewise, the second magneto-electric transducer head, having the second magneto-electric transducer and the second lagged magneto-electric transducer, may be made in the same manner as described for the first magneto-electric transducer head. In this manner, a flexible signal generator may be achieved, thus rendering usability with various magnetic scale devices having mutually different first predetermined divisions.

The geometrical angle may be substantially 45 degrees.

The configuration described herein may provide for the first lag of the magneto-electric transducer head to become a quarter wavelength irrespective of the first predetermined division distance.

The geometrical proximity may be selected such that the first magneto-electric transducer and the first lagged magneto-electric transducer are arranged at substantially the same location, such as, for example, with substantially no distance between the first lagged magneto-electric transducer and the first magneto-electric transducer.

The first lagged magneto-electric transducer and the first magneto-electric transducer me be Hall sensor transducers. One first wavelength may be generated by the distance of the two first predetermined divisions.

The geometrical angle may be substantially ninety degrees.

The first signal processing unit may include a Field programmable gate array circuit adapted to simultaneously process the first digital signal and the second digital signal.

The periodic variation may be arranged as a periodic oscillation.

The signal generator may include a device adapted to detect a signal edge in the periodically varying first digital signal, and a first counter for generating a first count value indicative of a number of detected signal edges so that the first count value is indicative of a first rotational position estimate of the scale device in relation to the signal generator.

The signal generator may include a device adapted to detect a signal edge in the periodically varying second digital signal, and a second counter for generating a second count value indicative of a number of detected signal edges so that the second count value is indicative of a second rotational position estimate of the scale device in relation to the signal generator.

The signal generator may be adapted for mounting on the machine part so that, in operation, the first magneto-electric transducer is positioned a second distance from the surface of the scale device, the second distance being substantially equal to the first distance or smaller than the first distance.

The signal generator may include a housing adapted to enclose the first magneto-electric transducer head and the second magneto-electric transducer head. The housing may include a wall for facing the machine part and a front wall for facing the shaft. The front wall may have a physical extension in a direction parallel to the elongation of the shaft, a physical extension in a direction orthogonal to the elongation of the shaft, and a concavely curved shape in the direction orthogonal to the elongation of the shaft. The first magneto-electric transducer head may be positioned in relation to the second magneto-electric transducer head such that, in operation, at least one of the first and second magneto-electric transducer heads will be positioned so as to detect the first magnetic field pattern.

According to example embodiments of the present invention, a signal generator, for mounting on a machine part and for co-operation with a scale device, includes: a housing; a first output terminal for providing an encoder output signal indicative of a relative change in position between the signal generator and the scale device; a second output terminal; a first device adapted to generate a periodically varying first digital signal such that the variation of the first digital signal exhibits a first wavelength when the signal generator moves along a first magnetic scale pattern of the scale device; and a second device adapted to generate a periodically varying second digital signal such that the variation of the second digital signal exhibits the first wavelength when the signal generator moves along the first magnetic scale pattern of the scale device.

The first device is adapted to also generate a periodically varying first lagged digital signal such that, in operation, the first lagged digital signal varies at a first lag in relation to the first digital signal when the shaft rotates in a clockwise rotational direction, and such that the first lagged electric signal varies at a second lag in relation to the first electric signal when the shaft rotates in a counterclockwise rotational direction, the second lag being different from the first lag. The second device is adapted to also generate a periodically varying second lagged digital signal such that, in operation, the second lagged digital signal varies at a first lag in relation to the second digital signal when the shaft rotates in a clockwise rotational direction, and such that the second lagged digital signal varies at a second lag in relation to the second digital signal when the shaft rotates in a counterclockwise rotational direction.

According to example embodiments of the present invention, an encoder includes the signal generator.

The encoder may include: a first position value estimator for generating a first position value estimate in dependence on at least one of the periodically varying first digital signal, and the periodically varying first lagged digital signal; and a second position value estimator for generating a second position value estimate in dependence on at least one of the periodically varying second digital signal, and the periodically varying second lagged digital signal.

The first position value estimator may include a first counter module adapted to generate a first count value by counting periods of the first wavelength in dependence on at least one of the periodically varying first digital signal, and the periodically varying first lagged digital signal. The first position value estimator may be adapted to generate the first position value estimate in dependence on the first count value. The second position value estimator may include a second counter module adapted to generate a second count value by counting periods of the first wavelength in dependence on at least one of the periodically varying second digital signal, and the periodically varying second lagged digital signal. The second position value estimator may be adapted to generate the second position value estimate in dependence on the second count value.

The first position value estimator may be adapted to generate the first position value estimate in dependence on a count value, which is generated by counting periods of the first wavelength of the periodically varying first digital signal, of the periodically varying first lagged digital signal, or of a periodically varying signal generated in response to one or both of the periodically varying first digital signal and the periodically varying first lagged digital signal. The second position value estimator may be adapted to generate the second position value estimate in dependence on a second count value, which is generated by counting periods of the first wavelength of the periodically varying second digital signal, of the periodically varying second lagged digital signal, or of a periodically varying signal generated in response to one or both of the periodically varying second digital signal and the periodically varying second lagged digital signal.

The first position value estimator may include a first arctan function generator module adapted to generate a first electrical angle value in dependence of the periodically varying first digital signal, and the periodically varying first lagged digital signal, so that the first electrical angle value is indicative of a position of a first magneto-electric transducer head within a distance corresponding to one first predetermined wavelength. The first position value estimator may be adapted to generate the first position value estimate in dependence on the first electrical angle value. The second position value estimator may include a second arctan function generator module adapted to generate a second electrical angle value in dependence of the periodically varying second digital signal, and the periodically varying second lagged digital signal, so that the second electrical angle value is indicative of a position of a second magneto-electric transducer head within a distance corresponding to one first predetermined wavelength. The second position value estimator may be adapted to generate the second position value estimate in dependence on the second electrical angle value.

The first position value estimator may include a first rotational direction detector module arranged to generate a first rotational direction signal indicative of a current direction of rotation of the shaft. The second position value estimator may include a second rotational direction detector module arranged to generate a second rotational direction signal indicative of a current direction of rotation of the shaft.

The first counter module may be adapted to adjust the first count value in dependence on the first rotational direction signal, and/or the second counter module may be adapted to adjust the second count value in dependence on the second rotational direction signal.

The first position value estimator may be adapted to generate the first position value estimate in dependence on the first electrical angle value and/or the first rotational direction signal and/or the first count value. The second position value estimator may be adapted to generate the second position value estimate in dependence on the second electrical angle value and/or the second rotational direction signal and/or the second count value.

The encoder may include a signal treatment module, having: a device adapted to generate a first head position value which is indicative of a position of a first magneto-electric transducer head; and a device adapted to generate a second head position value which is indicative of a position of a second magneto-electric transducer head.

The encoder may include an analyzer adapted to generate a scale gap indicator signal in response to detection of a deviation between the magnetic field pattern as sensed by a first magneto-electric transducer head and the magnetic field pattern sensed by a second magneto-electric transducer head; and/or in response to detection of a change in the magnetic field pattern as sensed by a first magneto-electric transducer head or the magnetic field pattern sensed by a second magneto-electric transducer head.

The encoder may include an analyzer adapted to generate a scale gap indicator signal in response to detection of a change in the magnetic field pattern as sensed by a first magneto-electric transducer head by a phase error signal switching from a state indicating no phase error to a state indicating the detection of a phase error.

Providing such a phase error signal may be used for indicating that the corresponding detector head is just entering a gap in the scale at the position visited by that detector head.

The encoder may be adapted to store the current first head position value, as a scale edge position value for the detector head.

The encoder may include an analyzer adapted to generate a scale gap indicator signal in response to detection of a change in the magnetic field pattern as sensed by a first magneto-electric transducer head by a phase error signal switching from a state indicating a phase error to a state indicating no phase error.

Providing such a phase error signal may be used for indicating that the corresponding detector head is just leaving a gap section and entering the scale at the position visited by that detector head.

The encoder may include an analyzer adapted to generate the scale gap indicator signal in dependence on a comparative analysis involving the first digital signal and the second digital signal, and/or a comparative analysis involving the first position value estimate and the second position value estimate.

The analyzer may be adapted to generate the scale gap indicator signal in dependence on a comparative analysis involving the first position value estimate and the second position value estimate. The analyzer may be adapted to generate a Both_On_Scale signal indicating that both the first magneto-electric transducer head and the second magneto-electric transducer head are in a position to detect the scale when both of the first position value estimate and the second position value estimate agree about the detected position or the detected amount of movement. The analyzer may be adapted to generate a signal indicating that one magneto-electric transducer head is not in a position to detect the scale when the first position value estimate and the second position value estimate disagree about the amount of movement.

The analyzer may be adapted to generate a First_Off_Scale signal indicating that the first magneto-electric transducer head is not in a position to detect the scale when the second position value estimate indicates a certain degree of movement whereas the first position value estimate indicates less movement or substantially no movement.

The analyzer may be adapted to generate a value indicative of a difference in detected movement, the difference value indicating a difference between the second position value estimate and the first position value estimate.

The output signal producer may include a synchronization module for synchronizing the second position value estimate and the first position value estimate so as to render the difference value to a predetermined value, such as, e.g., zero.

The analyzer may be adapted to read the difference value in response to the Both_On_Scale signal, and the analyzer may be adapted to store the difference value as a value indicative of a width of a gap between scale edges.

This arrangement may allow the encoder to measure the width of the gap, as experienced by the magneto-electric detector heads.

The analyzer may be adapted to generate the scale gap indicator signal in response to the difference value reaching a predetermined value.

The analyzer may be adapted to generate the scale gap indicator signal in response to the difference value reaching a predetermined value, e.g., corresponding to a certain ratio of the gap width value.

The analyzer may be adapted to generate the scale gap indicator signal in response to the difference value reaching a predetermined value, e.g., being substantially half of the gap width value.

An output signal producer of the encoder may be adapted to generate the output reference signal in dependence on the scale gap indicator signal.

The analyzer may be adapted to generate the scale gap indicator signal in response to the First_Off_Scale signal.

The first lag may substantially correspond to a quarter of the first wavelength, and the second lag may substantially correspond to three quarters of the first wavelength.

The first lagged magneto-electric transducer and the first magneto-electric transducer may include magneto-resistive transducers, and one first wavelength may be generated by the distance of the one first predetermined division.

The first lagged magneto-electric transducer, having a direction of sensitivity, may be positioned at a geometrical distance from the first magneto-electric transducer, also having a direction of sensitivity. The first magneto-electric transducer and the first lagged magneto-electric transducer may be arranged such that their respective directions of sensitivity are substantially parallel, and the first lag may depend on the geometrical distance.

The geometrical distance may be a quarter of the first predetermined division. Thus, the first lag may become a quarter wavelength.

The first lagged magneto-electric transducer, having a direction of sensitivity, may be positioned in geometrical proximity to the first magneto-electric transducer, also having a direction of sensitivity. The first magneto-electric transducer and the first lagged magneto-electric transducer may be arranged such that there is a geometrical angle between their respective directions of sensitivity, and the first lag may depend on the geometrical angle.

This arrangement may render the first lag to be independent of the first predetermined division of the scale device. Hence, the first magneto-electric transducer head having the first magneto-electric transducer and the first lagged magneto-electric transducer may be used together with different scale devices having mutually different first predetermined divisions. Likewise, the second magneto-electric transducer head, having the second magneto-electric transducer and the second lagged magneto-electric transducer, may be made in the same manner as described for the first magneto-electric transducer head. In this manner, a flexible signal generator may be achieved, thus rendering usability with various magnetic scale devices having mutually different first predetermined divisions.

The geometrical angle may be substantially 45 degrees. Thus, the first lag of the magneto-electric transducer head may become a quarter wavelength irrespective of the first predetermined division distance.

The geometrical proximity may be selected such that the first magneto-electric transducer and the first lagged magneto-electric transducer are arranged at substantially the same location, such as, for example, with substantially no distance between the first lagged magneto-electric transducer and the first magneto-electric transducer.

The first lagged magneto-electric transducer and the first magneto-electric transducer may include Hall sensor transducers, and one first wavelength may be generated by the distance of the two first predetermined divisions.

The geometrical angle may be substantially ninety degrees.

The periodically varying first digital signal and the periodically varying first lagged digital signal may be generated by a first magneto-electric transducer head when the first magneto-electric transducer head moves along a first magnetic scale pattern. The analyzer may be adapted to generate the scale gap indicator signal in dependence on an amplitude analysis of the periodically varying first digital signal and the periodically varying first lagged digital signal using the fact that they are substantially quadrature signals when the first magneto-electric transducer moves along a first magnetic scale pattern.

Since the two signals are substantially quadrature signals, the Pythagoras relation stating that Sqr(A)+Sqr(B) is constant, leads to the effect that the sum of the squares is substantially constant when the first magneto-electric transducer head moves along a first magnetic scale pattern. However, when the first magneto-electric transducer head passes over a scale edge the sum of the squares becomes lower, which may be due to the magnetic field becoming weaker in the gap portion of the scale. This may be used for detecting an edge of the magnetic scale.

The periodically varying second digital signal and the periodically varying second lagged digital signal may be generated by a second magneto-electric transducer head when the second magneto-electric transducer head moves along a first magnetic scale pattern. The analyzer may be adapted to generate the scale gap indicator signal in dependence on an amplitude analysis of the periodically varying second digital signal and the periodically varying second lagged digital signal using the fact that they are substantially quadrature signals when the first magneto-electric transducer moves along a first magnetic scale pattern.

The analyzer may be adapted to set a first amplitude reference value in dependence on the sum of the square of the periodically varying first digital signal and the square of the periodically varying first lagged digital signal. The analyzer may be adapted to set a second amplitude reference value in dependence on the sum of the square of the periodically varying second digital signal and the periodically varying second lagged digital signal.

The analyzer may be adapted to generate the scale gap indicator signal in dependence on a relation between the first amplitude reference value and the second amplitude reference value.

The encoder may include an analyzer adapted to generate a scale gap indicator signal in response to detection of a change in the magnetic field pattern as sensed by a first magneto-electric transducer head by a phase error signal switching from a state indicating no phase error to a state indicating the detection of a phase error.

Providing such a phase error signal may be used for indicating that the corresponding detector head is just entering a gap in the scale at the position visited by that detector head.

The encoder may include an analyzer adapted to generate a scale gap indicator signal in response to detection of a change in the magnetic field pattern as sensed by a first magneto-electric transducer head by a phase error signal switching from a state indicating no phase error to a state indicating the detection of a phase error.

Providing such a phase error signal may be used for indicating that the corresponding detector head is just entering a gap in the scale at the position visited by that detector head.

The first lagged magneto-electric transducer, having a direction of sensitivity, may be positioned at a geometrical distance from the first magneto-electric transducer, also having a direction of sensitivity. The first magneto-electric transducer and the first lagged magneto-electric transducer may be arranged such that their respective directions of sensitivity are substantially parallel, and the first lag may depend on the geometrical distance.

The geometrical distance may substantially correspond to one half of the first predetermined division, and the first magneto-electric transducer and the first lagged magneto-electric transducer may include Hall sensor transducers.

This arrangement may render the first lag to become a quarter wavelength.

The encoder may include a signal treatment module, having a device adapted to generate a first head position value which is indicative of a position of a first magneto-electric transducer head, and a device adapted to generate a second head position value which is indicative of a position of a second magneto-electric transducer head.

The encoder may include an analyzer adapted to generate a direction signal indicative of a direction of rotation in dependence on the lag value generated in response to signals emanating from the first magneto-electric transducer head, or the lag value generated in response to signals emanating from the second magneto-electric transducer head. During a first direction of rotation, the first magneto-electric transducer head would pass a certain position of the scale before the second magneto-electric transducer head passes the certain position of the scale. During a second direction of rotation, the first magneto-electric transducer head would pass a certain position of the scale after the second magneto-electric transducer head passes the certain position of the scale.

The encoder may include a signal treatment module, which includes a device for switching between a first state and a second state, in which the second head position value is relied on for the delivery of the encoder output signal during the first state, and the first head position value is relied on for the delivery of the encoder output signal during the second state. The signal treatment module may be adapted to select the first state in dependence on the analyzer generating a Both_On_Scale signal indicating that both the first magneto-electric transducer head and the second magneto-electric transducer head are in a position to detect the scale when both of the first position value estimate and the second position value estimate agree about the detected position or the detected amount of movement, and the direction signal may indicate the first direction of rotation.

During the first state, when the direction signal still indicates the first direction of rotation: the signal treatment module may be adapted to deduce, in response to the scale gap indicator signal, that the first magneto-electric transducer head is positioned within a gap, and then the signal treatment module may be adapted to maintain the first state so that the second head position value is relied on for the delivery of the encoder output signal.

During the first state, when the direction signal still indicates the first direction of rotation: the signal treatment module may be adapted to deduce that the first magneto-electric transducer head is positioned within a gap in response to the difference value reaching a predetermined value, the predetermined value being, e.g., substantially half of the gap width value; and the signal treatment module may be adapted to deduce that the first magneto-electric transducer head and the second magneto-electric transducer head are positioned on opposite sides of the gap when the direction signal still indicates the first direction of rotation and the difference value has reached a second predetermined value, the second predetermined value substantially corresponding to the gap width value or to a value exceeding the gap width value.

The predetermined distance between the first magneto-electric transducer head and the second magneto-electric transducer head may be longer than the sum of the gap width and at least one first predetermined division, in the case that the first and second magneto-electric transducer heads are magneto-resistive transducer heads. The predetermined distance between the first magneto-electric transducer head and the second magneto-electric transducer head may be longer than the sum of the gap width and at least two first predetermined divisions, in the case that the first and second magneto-electric transducer heads are Hall sensor transducer heads.

This arrangement may ensure that there is a transition period covering a distance of at least one wave length for switching from relying on the trailing transducer head to relying on the leading transducer head in connection with a gap cross-over. Hence, this arrangement allows for both of the trailing transducer head and the foremost, leading transducer head to simultaneously detect at least one full electric signal wave length, i.e., a first predetermined wavelength, after the leading transducer head having crossed the gap, and before the output signal is switched over to be generated in dependence on the leading transducer head.

The predetermined distance between the first magneto-electric transducer head and the second magneto-electric transducer head may be longer than the sum of the gap width and at least three first predetermined divisions, in the case that the first and second magneto-electric transducer heads are magneto-resistive transducer heads. The predetermined distance between the first magneto-electric transducer head and the second magneto-electric transducer head may be longer than the sum of the gap width and at least six first predetermined divisions, in the case that the first and second magneto-electric transducer heads are Hall sensor transducer heads.

This arrangement may leave room for allowing the transition, from the relying on the trailing transducer head to relying on the leading transducer head in connection with a gap cross-over, to take place at positions on the scale having a more reliable a first magnetic field pattern than that existing at an edge of the magnetic scale pattern. Near an edge of the magnetic scale pattern, the first magnetic field pattern displays fringe effects that may have a negative influence on the quality of the electric signals produced by the transducers when they are positioned near an edge of the magnetic scale pattern. In other words, the scale pattern quality of the first magnetic field pattern is better at a distance from an edge of the magnetic scale pattern.

The signal treatment module may have a first state and a second state. The trailing second head position value may be relied on for the delivery of the encoder output signal during the first state, and the leading first head position value may be relied on for the delivery of the encoder output signal during the second state. The signal treatment module may be adapted to cause switching between a first state and a second state during a transition period, and the transition period may depend on the distance of movement measured in terms of the first predetermined wavelength.

The signal treatment module may be adapted to allow the transition period to extend over at least one first predetermined wavelength.

The signal treatment module may be adapted to cause the transition period to be initiated when the reliable trailing second head position value indicates that the trailing second head is positioned at a distance corresponding to at least one and a half first predetermined divisions from a scale edge.

This arrangement may provide for a transition from the reliable trailing second head position value to the leading head position value when both of the heads are positioned at a distance of at least $1.5 * \Delta_1$ from the edges of the magnetic scale at the transition occurring when the heads are straddling the gap, thereby avoiding magnetic field pattern fringe effects during the transition period. This may lead to an improved measuring accuracy, e.g., since synchronization of the first and second head position values leads to more reliable results at a distance from the edges of the magnetic scale. Moreover, the next transition from relying on the leading head to relying on the trailing head may also be initiated when the trailing second head position value indicates that the trailing second head is positioned at a distance corresponding to at least one and a half first predetermined divisions from a scale edge, after the trailing head passage of the gap.

The signal treatment module may be adapted to cause the transition period to be initiated when the reliable trailing second head position value indicates that the trailing second head is positioned at a distance corresponding to at least six first predetermined divisions from a scale edge.

The signal treatment module may be adapted to cause the transition period to be initiated when the reliable trailing second head position value indicates that the trailing second head is positioned at a distance corresponding to at least eight first predetermined divisions from a scale edge.

The signal treatment module may be adapted to cause switching between a first state and a second state during a transition period, in which the transition period depends on the distance of movement measured in terms of the first predetermined wavelength.

The signal treatment module may have a first state and a second state. During movement, one magneto-electric transducer head may have a leading position and the other magneto-electric transducer head may have a trailing position in relation to the scale device. The signal treatment module may be adapted to rely on the trailing transducer head position value for the delivery of the encoder output signal during the first state, and the signal treatment module may be adapted to rely on the leading transducer head position value for the delivery of the encoder output signal during the second state. The signal treatment module may be adapted to cause switching between a first state and a second state during a transition period, and the transition period may depend on the distance of movement measured in terms of the first predetermined wavelength.

In this connection, the switching is not time controlled but it is rather performed by a procedure that occurs during the movement of the transducer heads.

In some instances, the signals generated by the magneto-electric transducers may deviate somewhat from an ideal sine wave shape, and/or cosine wave shape. When the position estimates produced by the first position value estimator and/or the second position value estimator are generated by an arctan function, as mentioned above, the resulting position estimate may therefore deviate slightly from the true relative position. This deviation, or position error, fluctuates. This deviation, or position error, fluctuates with a period of fluctuation, and that the period of fluctuation coincides with the period of the first predetermined wavelength of the magneto-electric transducer signals.

The signal treatment module may be adapted to receive a plurality of trailing transducer head position values and a plurality of leading transducer head position values, during the transition period. The values may be collected as signal pairs, each pair including one trailing transducer head position value and one leading transducer head position value. The two values in a pair may be collected at substantially the same instances.

The signal treatment module may be adapted to calculate an average difference value between the trailing transducer head position value and the leading transducer head position value, average difference value being calculated during the transition period.

The signal treatment module may be adapted to collect at least j signal pairs for the calculation of the average difference value, j being an integer, e.g., larger than 4, and preferably larger than 7.

The signal treatment module may be adapted to perform a synchronization process during the transition period so as to provide the switching to render a substantially smooth transition from relying on the trailing transducer head position value to relying on the leading transducer head position value for the delivery of the encoder output signal.

The deviation value may be used for achieving a smooth transition from relying on detector group to relying on detector group.

The encoder may include an encoder user interface adapted to allow a user to select the use of a selectable scale gap indicator signal. The encoder may allow for the setting of an offset parameter value, which is indicative of a distance from the position of the scale device where the selected scale gap indicator signal is generated to a position of the scale device which may be firmly attached to the shaft. The encoder may be adapted to identify a reference amplitude value in the signal generated by an arctan function generator module. The reference amplitude value may occur at a position which is located at a distance substantially corresponding to the offset parameter value from the position where the selected scale gap indicator signal is generated, and the encoder may be adapted to store the reference amplitude value as a reference amplitude value.

The selected scale gap indicator signal is generated as described above.

According to example embodiments of the present invention, in a method for generating a reference signal by an encoder, e.g., such as that described above, in which a selected scale gap indicator signal will occur once per revolution, a distance meter is started in response to the reception of the selected scale gap indicator signal. When the distance meter indicates an offset distance from the occurrence of the selected scale gap indicator signal, a comparison is performed between a current value of a periodically varying digital signal and the stored reference amplitude value; and, in response to the current value equaling the stored reference amplitude value, the encoder is adapted to generate a fix point reference signal.

An encoder output reference signal may be generated in response to the fix point reference signal.

The digital signal may be a signal generated by an encoder as described above.

It may be desirable to provide an incremental output signal, in which the increments are equally distributed over a revolution without having to perform any division calculation.

For example, the scale device may have a circumference of 203.64 first predetermined divisions $\Delta_1$, i.e. so that the transducers may provide 203.64 signal periods on one shaft revolution.

An incremental output signal having 2048 ppr may be provided. This may be achieved by identifying the nth signal edge by the condition that the position value >n*step_length, where step_length=203.64/(4*2048)=0.02485839844 and n goes from 1 to 8192.

The second last edge of the revolution should come when the position value exceeds the value 8191*step_length=203.6151416.

Unfortunately, it may be slow to calculate that many decimals in an FPGA circuit.

It may be provided to truncate after four decimals, so that the step_length=0.0248. The truncated value may lead to an edge position value of 8191*0.0248=203.1368 which may be incorrect even at the first decimal.

Another possibility is, for example, to calculate the edge positions by $$(n*L)/8192$$

for every step so as to avoid the accumulation of truncation errors.

This may be performed easier if the number of pulses per revolution is of the type $2^N$, where N is a natural number. However, if the pulse rate is something else, it could take some time to calculate which will delay the incremental pulse. It may also be difficult to implement a division in an FPGA circuit with the large number of bits that is needed in order to represent a sufficient number of decimals.

The following condition may be used:

$$\text{Position}*8192 > n*203.64.$$

The condition according to this arrangement may avoid the truncation and time delay. In this manner, for example, the 8191st flank is calculated by the condition:

$$\text{Position}*8192 > 8191*203.64 = 1.366437888*10^{10}.$$

It is a large number so it requires a large number of bits to be representable. But that is easy to handle, because no further calculation such as a division may be necessary.

An incremental index pulse (Nullimpulse) may be generated in response to n=1.

According to example embodiments, an encoder, for detection of rotational movement of a rotatable shaft in relation to a part of a machine, includes a scale device for attachment to a circumference of the shaft for providing a measuring path. The scale device has a width and a length and includes a magnetic scale pattern having a plurality of magnetic pole elements provided with a first predetermined division in the direction of the length so as to generate a magnetic field pattern at a first distance from a surface of the scale device. A signal generator is provided for mounting on the machine part. The signal generator includes a housing having a physical extension in a first direction parallel to the axis of rotation of the shaft, and a physical extension in a direction orthogonal to the first direction. The signal generator includes a first output terminal for providing an encoder output signal indicative of a relative change in position between the signal generator and the scale device. The signal generator also includes a second output terminal for providing a reference signal, as well as a first magneto-electric transducer head having a first magneto-electric transducer adapted to generate a first electric signal in response to detection of the magnetic field pattern so that the first electric signal varies periodically in dependence on the magnetic field pattern such that the variation exhibits a first wavelength which depends on the first predetermined division when the first magneto-electric transducer moves along said magnetic scale pattern. The signal generator also includes a first signal processing unit, having a first device adapted to generate a periodically varying first digital signal in dependence on the first electric signal such that the variation of the first digital signal exhibits the first wavelength when the first magneto-electric transducer moves along the magnetic scale pattern, and a device for detecting a signal edge in the periodically varying first digital signal. The signal generator furthermore includes a counter for generating a count value indicative of a number of detected signal edges, a memory having a memory location having a certain data value, and an analyzer adapted to generate an indicator signal in dependence on a comparison between the count value and the certain data value, e.g., once per shaft revolution. The signal generator also includes an output signal producer adapted to produce the encoder output signal in dependence on the first digital signal, the second digital signal, and the scale gap indicator signal. The output signal producer is adapted to produce the reference signal in dependence on the scale gap indicator signal.

Further features and aspects of example embodiments of the present invention are described in more detail below with reference to the appended Figures.

DETAILED DESCRIPTION

Figure 1:
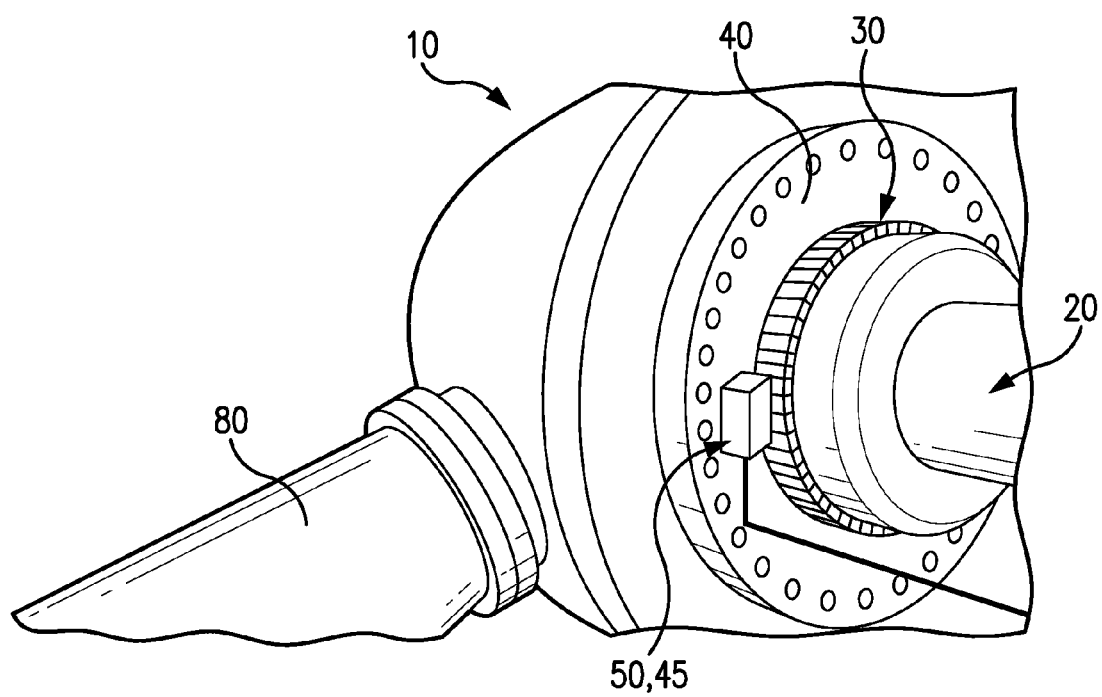
FIG. 1 schematically illustrates a perspective view of an encoder system and parts of a machine to which the encoder system is applied according to an example embodiment of the present invention.

FIG. 1 is a block diagram illustrating a machine 10 having a rotatable shaft 20. A scale device 30 may be fastened to the shaft 20 so that the scale device 30 moves when the rotatable shaft 20 rotates in relation to a machine part 40. A signal generator 45 may be attachable to the machine part 40. The signal generator 45 may be adapted to generate a signal indicative of a position of the scale device 30 in relation to the signal generator 45, and/or a signal indicative of a relative change in position between the signal generator 45 and the scale device 30.

The machine 10 may be arranged in a wind power station 10, as illustrated in FIG. 1. Hence, the shaft 20, of the wind power station 10, may be attached to one or more turbine/rotor blades 80 adapted to cause rotation of the shaft 20 in response to air movement caused by wind so as to generate electric power by a generator coupled to the shaft 20. The wind power station may be a geared wind power station, a direct drive (gearless) wind power station or a hybrid drive wind power station.

The example embodiments described herein may be combined with one another. These example embodiments and advantages associated with them are discussed in more detail below.

Figure 2:
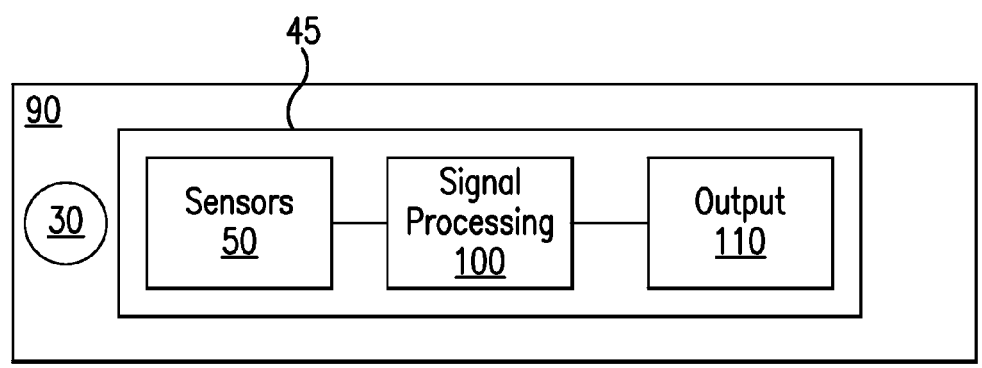
FIG. 2 schematically illustrates a block diagram of an encoder system according to an example embodiment of the present invention.

FIG. 2 is a schematic block diagram illustrating an example embodiment of a system 90 for detecting movement and/or position of a rotatable shaft, such as the shaft 20 of FIG. 1. The encoder system 90 may include a scale device 30 and a signal generator 45. When the encoder system 90 is in operation, the signal generator 45 and the scale device 30 are movable in relation to each other. The signal generator 45 includes a detector device 50 adapted to generate at least one sensor signal in response to a relative change in position between the detector device 50 and the scale device 30.

The detector device 50 is coupled to a signal processing device 100 which is adapted to generate at least one output signal in dependence on the at least one sensor signal. The at least one output signal is delivered to an output 110. Hence, the signal generator 45 may be adapted to generate at least one output signal in response to a relative change in position between the signal generator 45 and the scale device 30. The output signal may be a square wave signal or sine signal, a single-channel or multichannel signal or a signal representing a digitally coded incremental position. Alternatively the output signal may be signal derived directly from one of these signals or from a combination of these signals.

According to example embodiments, the scale device 30 may include an encoding band 30 which is attachable around the perimeter of the shaft 20, the encoding band 30 being providable with information which is detectable by the detector device 50. Alternatively, the scale device 30 may include an encoding ring 30 or an encoding tape 30.

The system 90 may include additional components than the exemplified components with reference to FIG. 2. For example the system 90 may include an analog-to-digital (A/D) converter arranged to convert the generated at least one sensor signal to a digital representation. Furthermore, the system 90 may include a digital-to-analog (D/A) converter (See FIG. 4) arranged to convert the generated at least one output signal from the signal processing device into an analog representation.

The scale device 30 may include at least one encoding tape such as at least one magnetic encoding tape, having one or more magnetic scale tracks. The scale device 30 may alternatively include at least one magnetic encoder ring or encoder belt. The detector device 50 may include a magnetic encoder detector such as a magneto-resistive transducer (MR), a giant magneto-resistive transducer (GMR), a colossal magneto-resistive transducer (CMR), a tunneling magneto-resistive transducer (TMR) or other suitable detector.

Figure 3A:
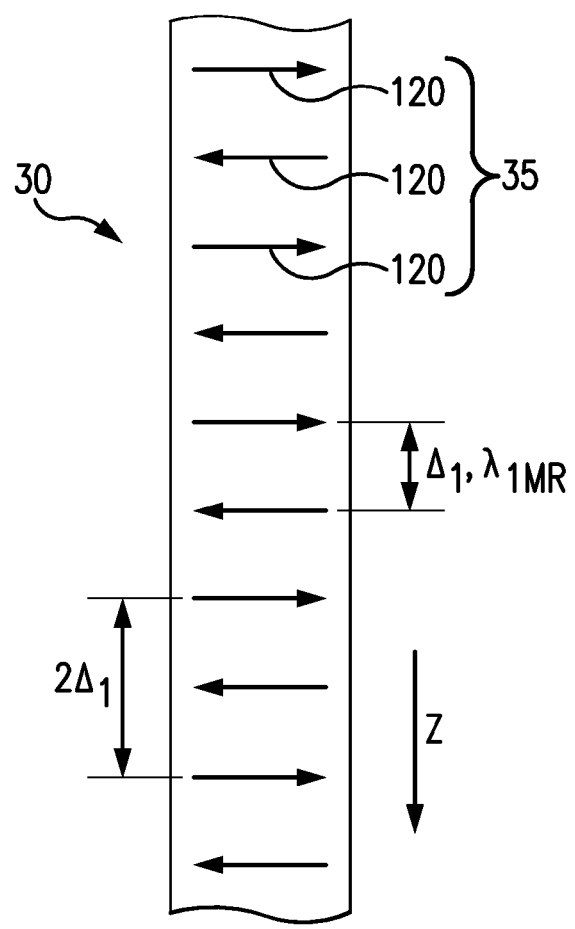
FIG. 3A schematically illustrates a plan view of a portion of a magnetic tape according to an example embodiment of the present invention.

FIG. 3A illustrates an example embodiment of a scale device 30 having a magnetic scale pattern 35. The magnetic scale pattern 35 may include a plurality of successive equidistant magnetic pole elements 120.

According to example embodiments, scale device 30 is provided with information in the form of a magnetic scale pattern 35. The magnetic scale pattern 35 includes a magnetic medium which is provided with a graduation in the form of successive equidistant magnetic pole elements 120. Hence, the magnetic scale pattern 35 exhibits incremental graduations. The incremental graduations of the scale may include a magnetic pattern having a first predetermined division $\Delta 1$, corresponding to the distance between adjacent magnetic pole elements 120, along a path in the direction of arrow Z (See FIG. 3A). When such a scale device 30 is used with a magneto resistive sensor unit, the first predetermined division $\Delta 1$ causes an electric signal having a wave length first predetermined wavelength $\lambda 1$ corresponding to the first predetermined division $\Delta 1$, as discussed in connection with FIG. 6A.

Figure 3B:
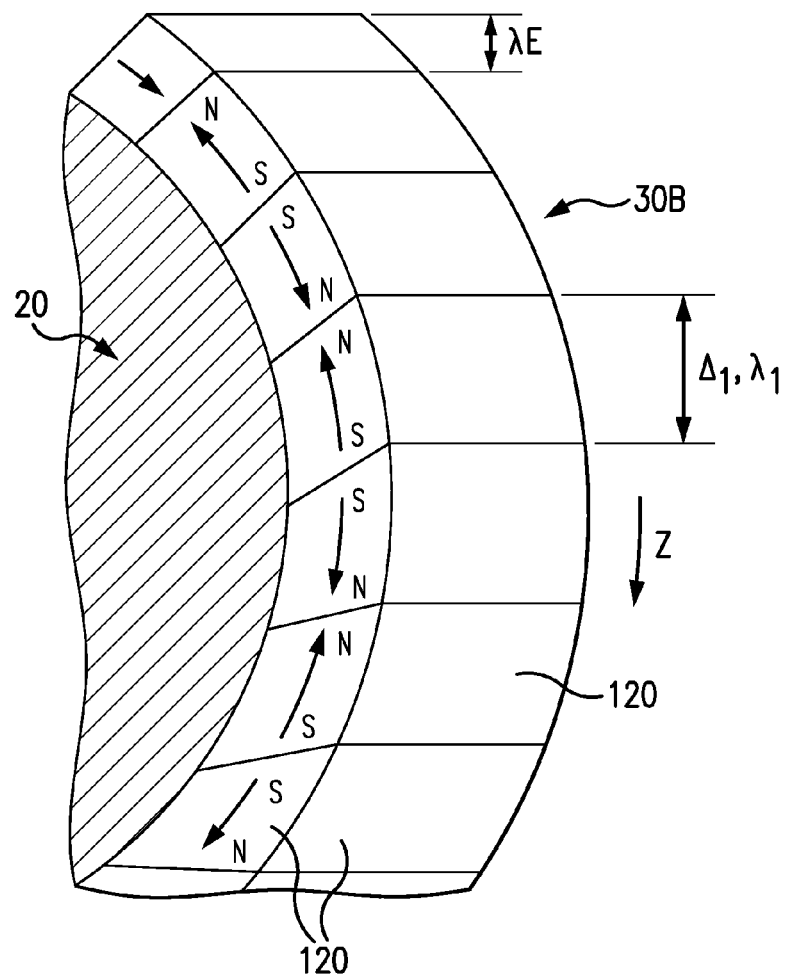
FIG. 3B schematically illustrates a perspective view of a portion of a magnetic tape applied to a shaft according to an example embodiment of the present invention.

FIG. 3B is a perspective view of a portion of an example embodiment 30B of the scale device 30, when applied on the perimeter of a shaft 20. The scale device 30B has plural equidistant magnetic pole elements, wherein adjacent magnetic pole elements 120 are positioned so that equal magnetic poles face each other. The magnetic pole elements 120 are positioned so that the magnetic poles are substantially parallel to the surface of the shaft 20 onto which the scale device 30B is attached and parallel to the direction of elongation of the scale device 30B, while the magnetic pole elements 120 are substantially orthogonal to the direction of the radius of the shaft 20. The magnetic north of one pole element faces the magnetic north of the adjacent pole element, as illustrated in FIG. 3B. The magnetic pole elements 120 of the scale device 30B may generate magnetic fields having magnetic flux lines that reach into space at a radial direction from the shaft 20 (see FIG. 1 in conjunction with FIG. 3B) onto which the scale device 30, 30B is mounted.

Figure 3C:
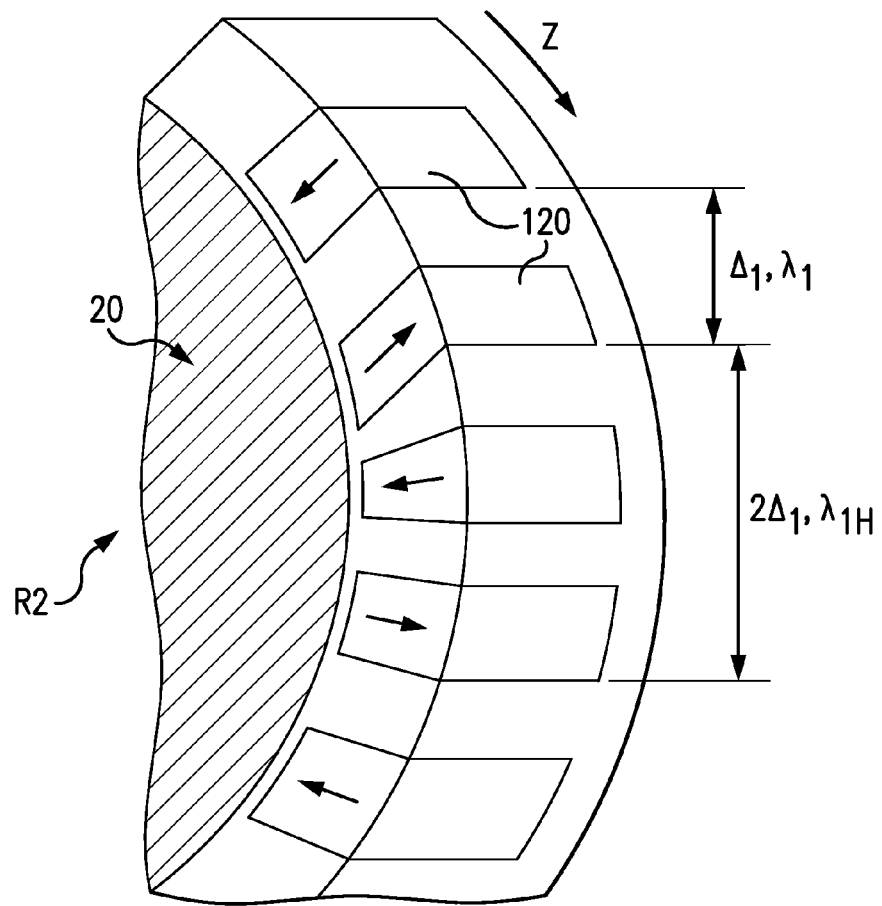
FIG. 3C schematically illustrates a perspective view of a portion of a magnetic tape applied to a shaft according to an example embodiment of the present invention.

FIG. 3C is a perspective view of a portion of another example embodiment 30C of the scale device 30, shown in FIG. 3A, when applied on the perimeter of a shaft 20. The scale device 30C has plural equidistant magnetic pole elements 120, wherein all magnetic pole elements 120 are positioned so that the magnetic poles are directed in a substantially radial direction in relation to the shaft 20. The magnetic pole elements 120 are positioned so that every other magnetic pole element 120 has a magnetic pole directed in the radial direction out from the center of the shaft 20, and the remaining magnetic pole elements have a magnetic pole directed in the radial direction in towards the center of the shaft 20, as shown in FIG. 3C.

Whereas both of the scale devices 30B and 30C generate a magnetic field that can be used as an incremental encoder scale, the example embodiment illustrated in FIG. 3C may allow cutting the band to a desired length while avoiding the creation of a magnetic pole having a shorter pole length $\lambda$.

Figure 4:
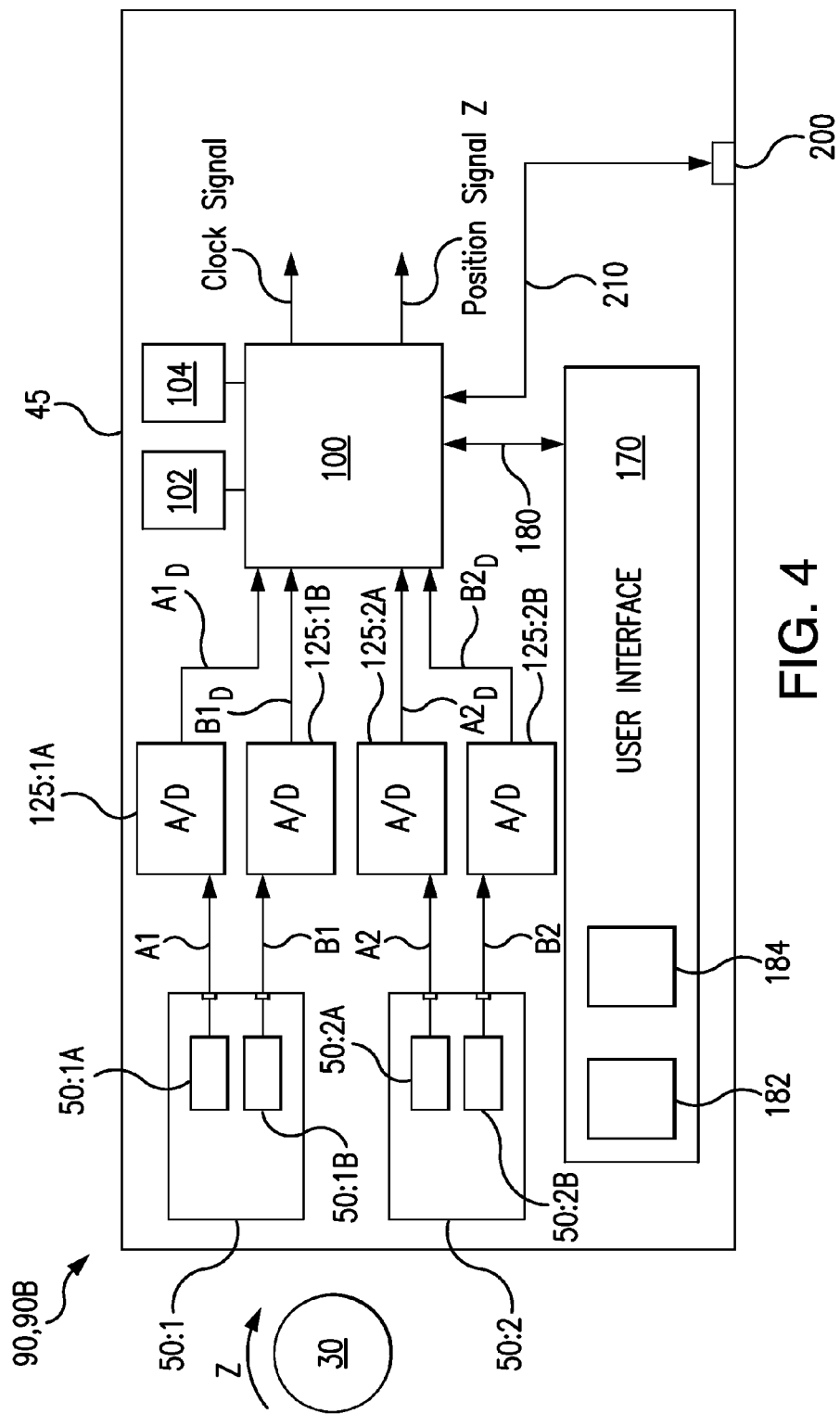
FIG. 4 schematically illustrates a block diagram of an encoder system according to an example embodiment of the present invention.

FIG. 4 is a block diagram illustrating an example embodiment 90B of the encoder 90 for detecting movement and/or position of a rotatable shaft, such as the shaft 20 of FIG. 1.

With reference to FIG. 4, the encoder 90 may include a scale device 30, and a signal generator 45. When the encoder system 90 is in operation, the signal generator 45 and the scale device 30 are movable in relation to each other, as discussed in connection with FIGS. 1 and 2 above. The signal generator 45 includes a first detector group 50:1 and a second detector group 50:2. The first detector group 50:1 includes a first transducer 50:1A adapted to generate a first electric signal A1, and a second transducer 50:1B adapted to generate a second electric signal B1. The first electric signal A1 and the second electric signal B1 constitute a first signal pair A1B1.

The first transducer 50:1A may be coupled to deliver the analog first electric signal A1 to a first A/D converter 125:1A which may be adapted generate a digital signal $A1_D$ in response to the analog first electric signal A1. Similarly, the second transducer 50:1B may be coupled to deliver the analog second electric signal B1 to a second A/D converter 125:1B which may be adapted to generate a digital signal $B1_D$ in response to the analog second electric signal B1.

The second group 50:2 of detector elements may include a third transducer 50:2A adapted to generate a third electric signal A2, and a fourth transducer 50:2B adapted to generate a fourth electric signal B2.

The third transducer 50:2A may be coupled to deliver the analog third electric signal A2 to a third A/D converter 125:2A which may be adapted generate a digital signal $A2_D$ in response to the analog third electric signal A2. Similarly, the fourth transducer 50:2B may be coupled to deliver the analog fourth electric signal B2 to a fourth A/D converter 125:2B which may be adapted generate a digital signal $B2_D$ in response to the analog second electric signal B2.

Each of the A/D converters 125:1A 125:1B 125:2A 125:2B sample their respective signals A1, B1, A2, and B2, respectively, at a predetermined sample rate $f_S$.

The signal generator 45 may also include a data processing unit 100 capable of controlling the operation of signal generator 45 in accordance with program code. The data processing unit 100 may also be coupled to a memory 102 for storing said program code. According to example embodiments, the data processing unit 100 may be adapted to receive the digital signals $A1_D$, $B1_D$, $A2_D$ and $B2_D$.

The program memory 102 may include a non-volatile memory. The memory 102 may be a read/write memory, i.e., providing both reading data from the memory and writing new data onto the memory 102. According to example embodiments, the program memory 102 includes a FLASH memory. According to example embodiments, the program memory 102 is integrated in the data processing unit 100 so that the program functions to be executed by the data processing unit 100 are stored within the data processing unit 100 itself.

The data processing unit 100 may also be coupled to a read/write memory 104 for data storage. According to example embodiments, the read/write memory 104 includes a non-volatile memory. This means that data written into the non-volatile read/write memory 104 will be retained even when the memory 104 is not powered.

When, in the following, it is described that the data processing unit 100 performs a certain function this is to be understood that, e.g., the data processing unit 100 performs a certain part of the program which is stored in the memory 102.

The data processing unit 100 may also be coupled to a user interface 170 via a data bus 180. The user interface 180 may include a display 182 and/or data input device 184, such as buttons 184 and or a touch screen 182/184 adapted to allow a user to feed data into the encoder via the display 182 on which the encoder supplies user information output.

A user of the encoder 90 may be provided with information messages by characters being displayed on the display 182. A particular message may be displayed in response to a certain event.

The data processing unit 100 may be coupled to the memory 102 by a data bus, and to the read/write memory 104 by another data bus. The data processing unit 100 may also communicate with a data port 200 by a data bus 210.

The wording "a computer program product, loadable into a digital memory of an encoder" means, for example, that a computer program can be introduced into a digital memory of an encoder 90, such as, e.g., the memory 102, so as to obtain an encoder programmed to be capable of, or adapted to, carrying out a method of the kind described herein. The term "loaded into a digital memory of a condition analysing apparatus" means, for example, that an encoder programmed in this manner is capable of, or adapted to, carrying out a method of the kind described herein.

The above mentioned computer program product may also be loadable onto a computer readable medium, such as a compact disc or DVD or USB memory stick. Such a computer readable medium may be used for delivery of the program to a client, in that the program may be loaded from the computer readable medium to the program memory 102, e.g., via port 200.

The data processing unit 100 may include a central processing unit, or microprocessor, for controlling the operation of the encoder 90. Alternatively, the data processing unit 100 may include a Digital Signal Processor (DSP).

According to example embodiments, the data processing unit 100 includes a Field Programmable Gate Array circuit 100, also referred to as an FPGA. The Field Programmable Gate Array circuit 100 may provide a combination of flexibility and very high performance to the encoder 90 in that a large amount of data can be processed relatively fast by the Field Programmable Gate Array circuit. This arrangement may provide for simultaneous signal treatment of two, three, or four detector signals, such as the digital signals $A1_D$, $B1_D$, $A2_D$, and $B2_D$. Moreover, the functions executed by the FPGA may be software controlled and the FPGA allows for truly parallel processing, which also contributes to increased performance to the encoder 90. Hence, the FPGA 100 may be coupled to receive, in real time, the digital signals $A1_D$, $B1_D$, $A2_D$, and $B2_D$ all of which are digital signals having a sample rate $f_S$.

The data processing unit 100 may be arranged to execute the program code stored in the memory 102 so as to cause the encoder 90 to execute one or several programs so as to cause any of the processes described herein to be executed.

Figure 5:
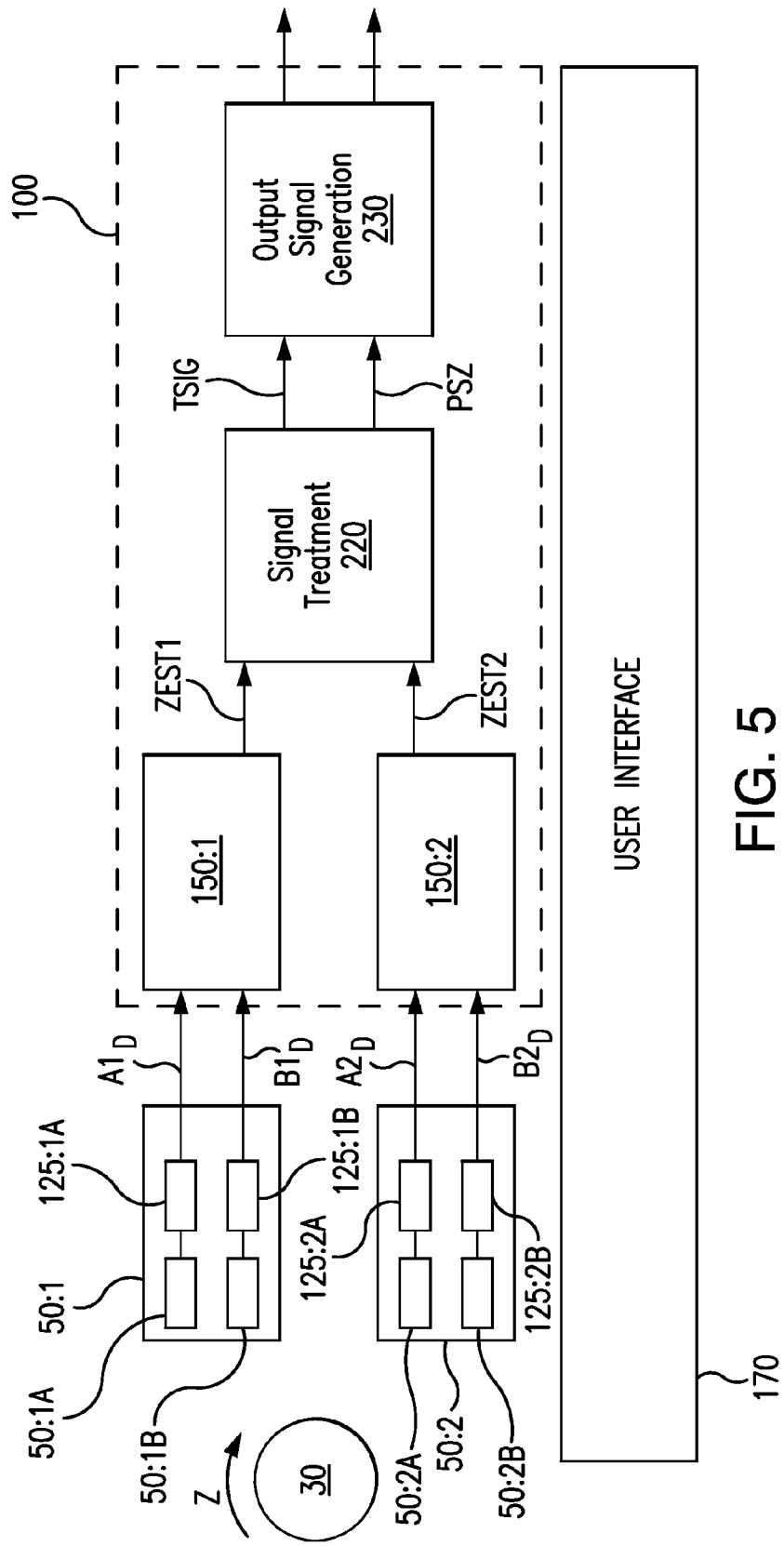
FIG. 5 schematically illustrates a block diagram of an encoder system according to an example embodiment of the present invention.

FIG. 5 is a block diagram illustrating an example embodiment of the system 90, 90B for detecting movement and/or position of a rotatable shaft, such as the shaft 20 of FIG. 1.

The system 90 may include a scale device 30 attached to a shaft 20 of a machine 10, as discussed in connection with FIGS. 1 to 4 above.

The system 90C may also include a detector device 50 having a first detector group 50:1 and a second detector group 50:2. The first detector group 50:1 may include a first transducer 50:1A and a first A/D converter 125:1A adapted generate a digital signal $A1_D$, and a second transducer 50:1B and a second A/D converter 125:1B adapted generate a digital signal $B1_D$ as described above in connection with FIG. 4.

Similarly, the second detector group 50:2 may include a third transducer 50:2A coupled to a third A/D converter 125:2A which may be adapted generate a digital signal $A2_D$ in response to the analog second electric signal B1, and a fourth transducer 50:2B and a fourth A/D converter 125:2B which may be adapted generate a digital signal $B2_D$ as described above in connection with FIG. 4.

Each of the A/D converters 125:1A 125:1B 125:2A 125:2B sample their respective signals A1, B1, A2, and B2, respectively, at a predetermined sample rate $f_S$ so as to generate corresponding digital signals $A1_D$, $B1_D$, $A2_D$, and $B2_D$, respectively.

The digital signals are delivered to the data processing unit 100. The data processing unit 100, when executing the programs stored in the memory 102, as described above in connection with FIG. 4, will perform functions which are described with reference to the block diagram of FIG. 5. Hence, according to example embodiments, the blocks denoted by reference numerals 150:1, 150:2, 220, 230 represent functions that may be performed by the data processing unit 100. As mentioned above, the data processing unit 100 may include a Field Programmable Gate Array circuit 100.

With reference to FIG. 1 and FIG. 5, it should be understood that when the shaft 20 rotates, the magnetic scale device 30 will move in relation to the detector unit 50.

With reference to FIG. 5, the encoder 90,90B may include a first position value estimator 150:1 for generating a first position value estimate $Z_{EST1}$ in dependence on at least one of the digital signals $A1_D$ and $B1_D$.

The system 90, 90B may also include a second position value estimator 150:2 for generating a second position value estimate $Z_{EST2}$ in dependence on at least one of the digital signals $A2_D$ and $B2_D$.

According to example embodiments, the first position value estimator 150:1 includes a first signal pair interpreter 150:1 adapted to receive the digital signals $A1_D$ and $B1_D$. The first signal pair interpreter 150:1 is adapted to generate a first estimated position signal $Z_{est1}$ in dependence on the received signal pair.

The system 90, 90B may also include a second signal pair interpreter 150:2 adapted to receive the second signal pair $A2_D$, and $B2_D$. The second signal interpreter 150:2 is adapted to generate a second estimated position signal $Z_{est2}$ in dependence on the received signal pair A2B2. This will be described in more detail in connection with, e.g., FIG. 7C.

Correlation between scale division and transducer output wavelength is described below.

Figure 6A:
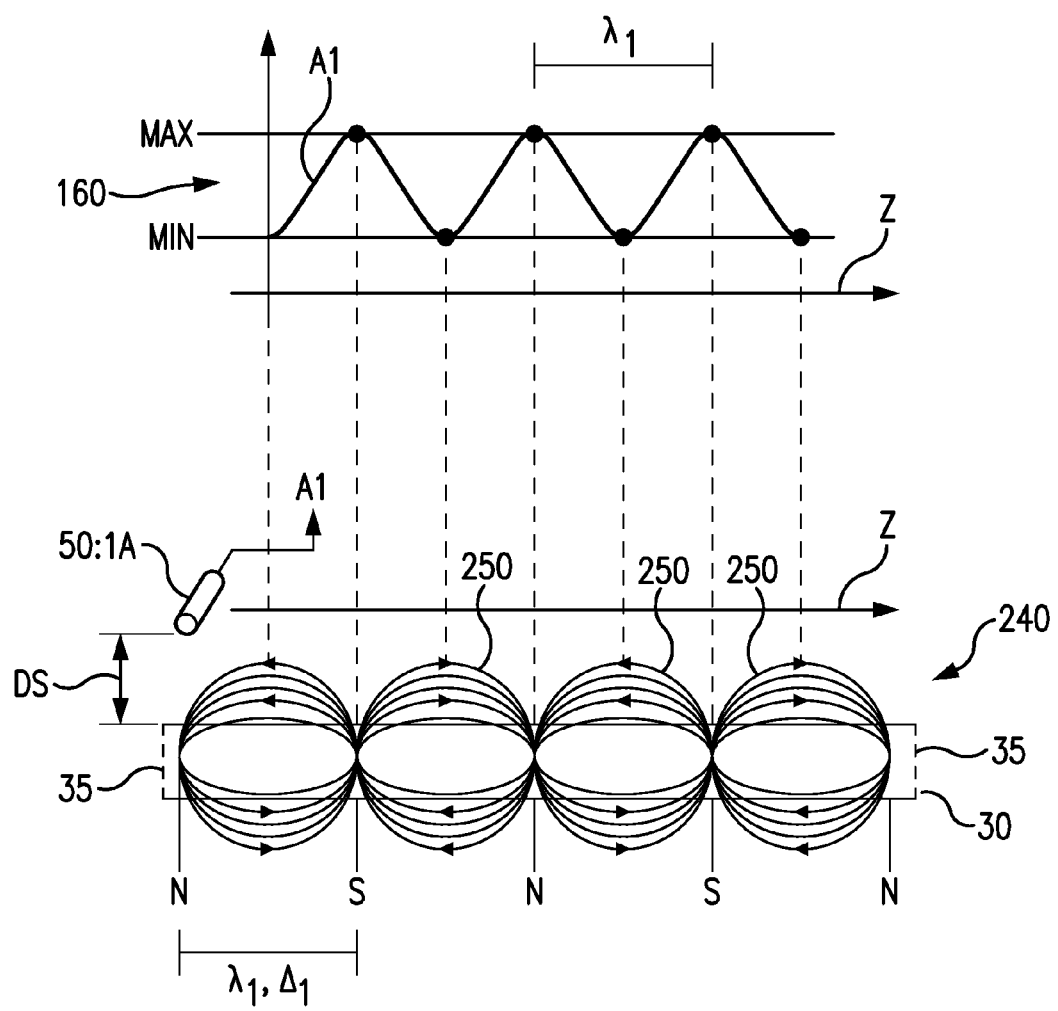
FIG. 6A schematically illustrates signal generation of a magnetic encoder according to an example embodiment of the present invention.

FIG. 6A is an illustration showing the transducer 50:1A of FIG. 5, and a scale device 30 having a magnetic scale pattern 35, as discussed in connection with FIGS. 3A, 3B, and/or 3C.

FIG. 6A illustrates a transducer 50:1A moving, in relation to the scale device 30, along a measuring path Z in the direction of the arrow (which is also denoted Z) at a distance $D_S$ from the surface of the scale device 30. Hence, the direction of travel of the transducer 50:1A is from the left to the right in FIG. 6A.

As shown in FIG. 6A, the magnetic pole elements 120 generate magnetic fields forming a magnetic field pattern 240 corresponding to the magnetic scale pattern 35. The magnetic field pattern 240 may be detectable at a distance $D_S$ from the surface of the scale device 30. The magnetic fields are illustrated by magnetic flux lines 250 in FIG. 6A.

The magneto-resistive transducer output wavelength is described below.

According to example embodiments, the transducer 50:1A includes a magneto-resistive transducer, whose resistance depends on the direction of the magnetic field passing through the magneto-resistive transducer body. When the magneto-resistive transducer moves along the measuring path z (in the direction of the arrow z as illustrated in FIG. 6A), the resistance of the magneto-resistive transducer will vary in dependence of the magnetic field pattern 240, and an amplitude of a detection signal may vary as illustrated by the diagram 160 in the upper portion of FIG. 6A. Hence, when the transducer 50:1A is supplied with a predetermined voltage, the current flowing through the transducer 50:1A will also vary, as illustrated by the diagram 160 in the upper portion of FIG. 6A, in dependence of a relative change in position between the signal generator 45 and the scale device 30.

According to example embodiments, the magneto-resistive transducer 50:1A may be connected in a bridge circuit, such as a Wheatstone bridge or a Carey Foster bridge. This may improve the accuracy with which the resistance variation of the magneto-resistive transducer may be detected.

As discussed in connection with FIGS. 3A and 3B, the incremental graduations of the scale may include a magnetic pattern having a first predetermined division $\Delta 1$, corresponding to the distance between adjacent magnetic pole elements 120, along a path in the direction of arrow Z (See FIG. 3A and/or FIG. 6A). When such a scale device 30 is used with a magneto-resistive sensor unit, the first predetermined division $\Delta 1$ may cause an electric signal A1 having an amplitude to vary with a first predetermined wavelength $\lambda 1$ corresponding to the first predetermined division $\Delta 1$, as illustrated in FIG. 6A. Hence, when the magneto-resistive sensor unit moves the first predetermined distance $\Delta_1$ along the measuring path z, the analog electric signal A1 will exhibit one first predetermined wavelength $\lambda 1$.

Hence, when the incremental graduations of the scale includes a magnetic pattern having a first predetermined division $\Delta 1$, a magneto-resistive transducer 50:1A, when moving along the measuring path Z, may generate an oscillating signal A1 in response to a detected magnetic field pattern 240. The oscillating analog electric transducer signal A1 may depend on transducer movement along the scale direction Z so as to exhibit one first predetermined wavelength $\lambda 1$ in response to moving one division $\Delta 1$.

The Hall transducer output wavelength is further described below.

Figure 6B:
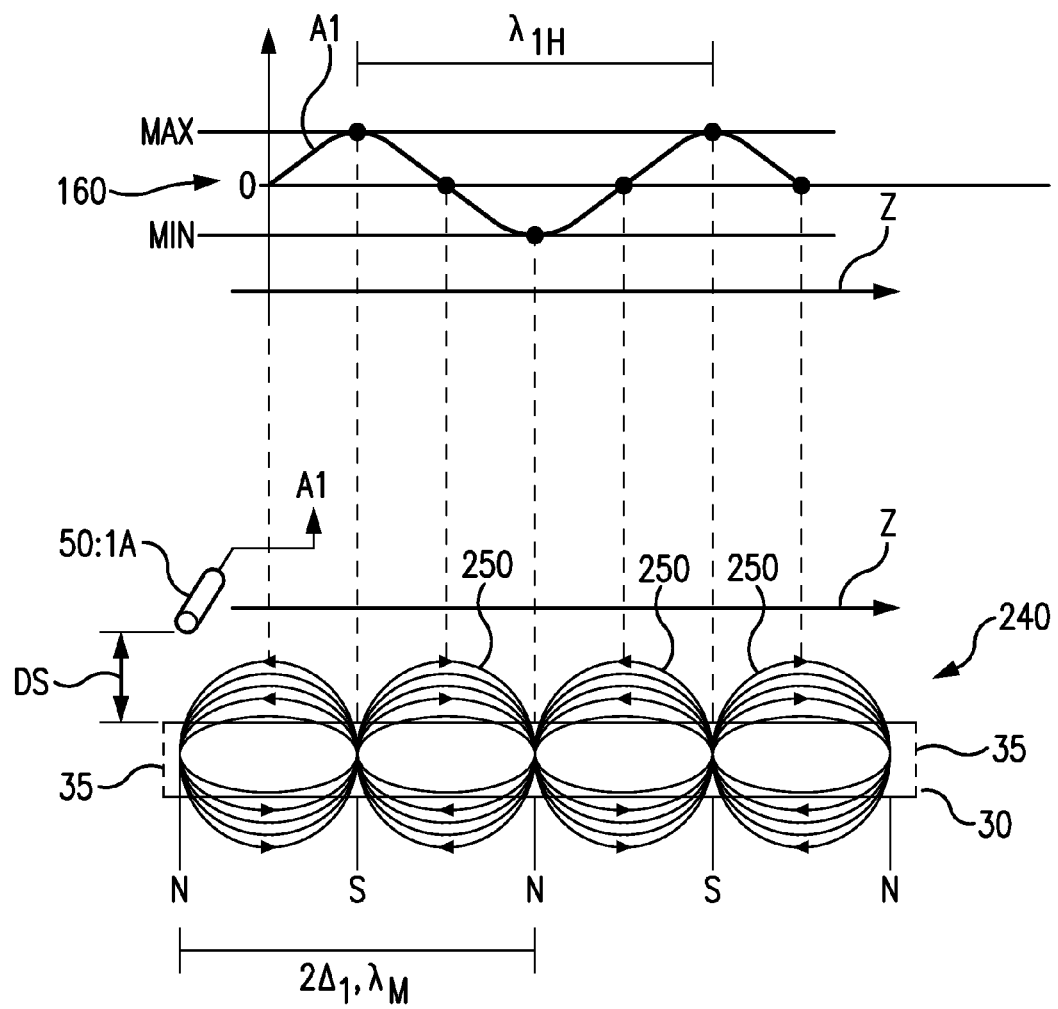
FIG. 6B schematically illustrates signal generation of a magnetic encoder according to an example embodiment of the present invention.

According to example embodiments of the encoder 90, 90B, the transducer 50:1A may be a Hall transducer. FIG. 6B is an illustration of the correlation between magnetic scale pattern 35 and the transducer output signal wave length in the case that the transducer 50:1A is a Hall transducer.

The Hall transducer may include an indium compound semiconductor crystal such as indium antimonide. When the Hall transducer is positioned so that the magnetic field lines are passing at right angles through the Hall transducer, the transducer may provide an output indicative of the value of magnetic flux density.

A current is passed through the crystal of the Hall transducer which, when placed in a magnetic field has a voltage occurring across it due to the "Hall effect". The Hall effect occurs due to a conductor being passed through a uniform magnetic field. When the Hall transducer moves along the measuring path in the direction z, the output of the Hall transducer will vary, as illustrated by the diagram 160 in the upper portion of FIG. 6B.

As discussed in connection with FIGS. 3A and 3B, the incremental graduations of the scale may include a magnetic pattern having a first predetermined division $\Delta 1$, corresponding to the distance between adjacent magnetic pole elements 120, along a path in the direction of arrow Z (See FIG. 3A and/or FIG. 6A). When such a scale device 30 is used with a Hall transducer unit, the first predetermined wavelength $\lambda 1$ of the electric output signal from the Hall transducer unit corresponds to $2*\Delta_1$, as illustrated in FIG. 6B. Hence, when the Hall transducer unit moves a distance of twice the first predetermined distance $\Delta 1$ along the measuring path z, the analog electric signal A1 will exhibit one first predetermined wavelength $\lambda 1$.

Figure 6C:
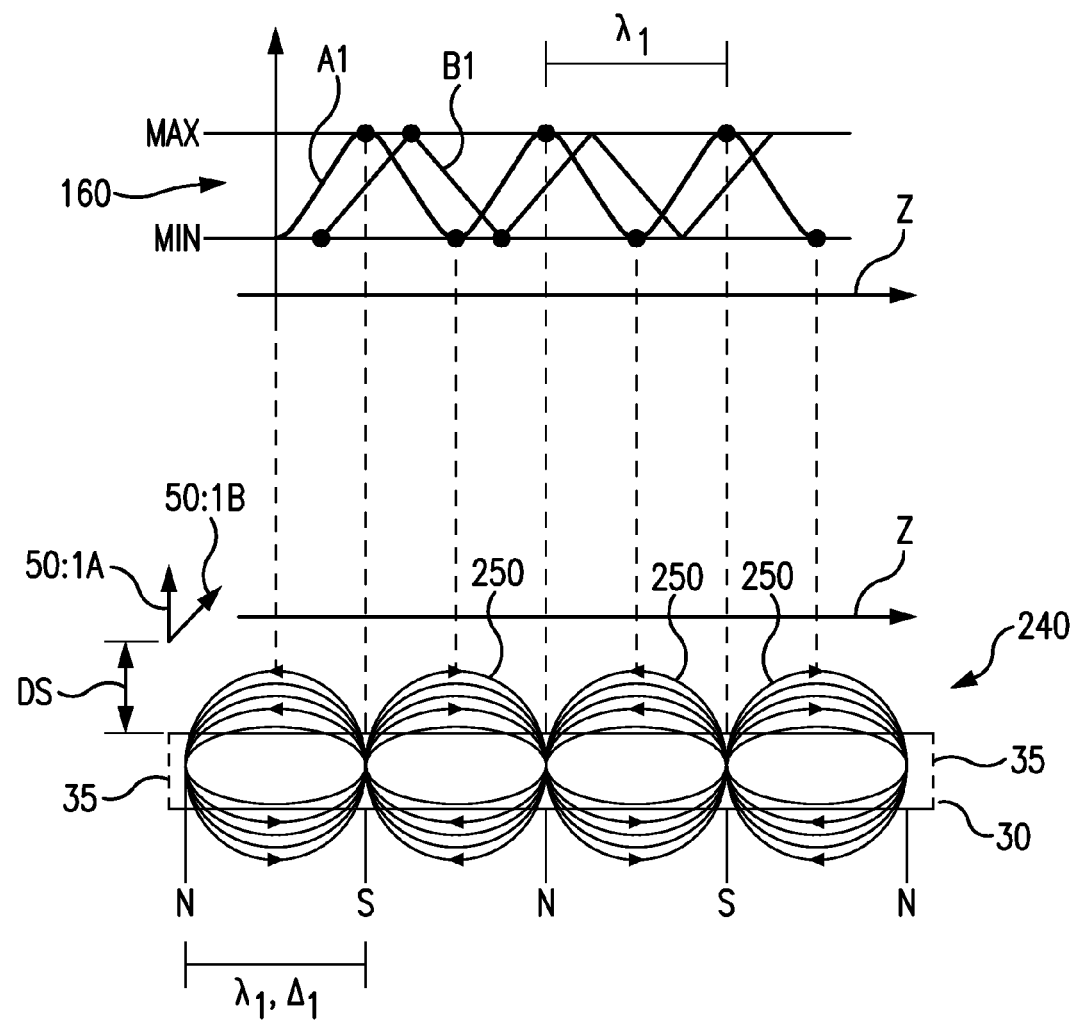
FIG. 6C schematically illustrates signal generation of a magnetic encoder according to an example embodiment of the present invention.

FIG. 6C is an illustration of the correlation between magnetic scale pattern 35 and the wave length and phase of the transducer output signals wave length when the transducers 50:1A and 50:1B are magneto-resistive transducers.

According to example embodiments, the first lagged magneto-electric transducer (50:1B), having a direction of sensitivity, is positioned at a geometrical distance from the first magneto-electric transducer (50:1A), also having a direction of sensitivity. The first magneto-electric transducer (50:1A) and the first lagged magneto-electric transducer (50:1B) are arranged such that their respective directions of sensitivity are substantially parallel. The first lag (PD) depends on the geometrical distance. According to example embodiments, the geometrical distance between the two transducers is a quarter of the first predetermined division ($\Delta_1$). This arrangement renders the first lag (PD) to become a quarter wavelength. However, if a different scale device is used, having a different predetermined division $\Delta_3$, deviating from the first predetermined division $\Delta_1$ then the electrical signals A1 and B1 will have another phase relationship.

According to example embodiments, the first lagged magneto-electric transducer (50:1B), having a direction of sensitivity, is positioned in geometrical proximity to the first magneto-electric transducer (50:1A), also having a direction of sensitivity. The first magneto-electric transducer (50:1A) and the first lagged magneto-electric transducer (50:1B) are arranged such that there is a geometrical angle between their respective directions of sensitivity, and the first lag (PD) depends on the geometrical angle.

This arrangement renders the first lag (PD) to be independent of the first predetermined division ($\Delta_1$) of the scale device. Hence, the first magneto-electric transducer head (50:1) having the first magneto-electric transducer (50:1A) and the first lagged magneto-electric transducer (50:1B) may be used together with different scale devices 30 having mutually different first predetermined divisions ($\Delta_1$). Likewise, the second magneto-electric transducer head (50:2), having the second magneto-electric transducer (50:2A) and the second lagged magneto-electric transducer (50:2B), may be made in the same manner as described for the first magneto-electric transducer head (50:1). In this manner, a flexible signal generator (45, 50) may be achieved, thus rendering usability with various magnetic scale devices having mutually different first predetermined divisions ($\Delta_1$).

According to example embodiments, the geometrical angle is substantially 45 degrees, as illustrated in FIG. 6C. This arrangement renders the first lag (PD) of the magneto-electric transducer head to become a quarter wavelengths irrespective of the first predetermined division ($\Delta_1$) distance.

According to example embodiments, the geometrical proximity is such that the first magneto-electric transducer (50:1A) and the first lagged magneto-electric transducer (50:1B) are arranged at substantially the same location, such as, for example, with substantially no distance between the first lagged magneto-electric transducer (50:1B) and the first magneto-electric transducer (50:1A).

Figure 6D:
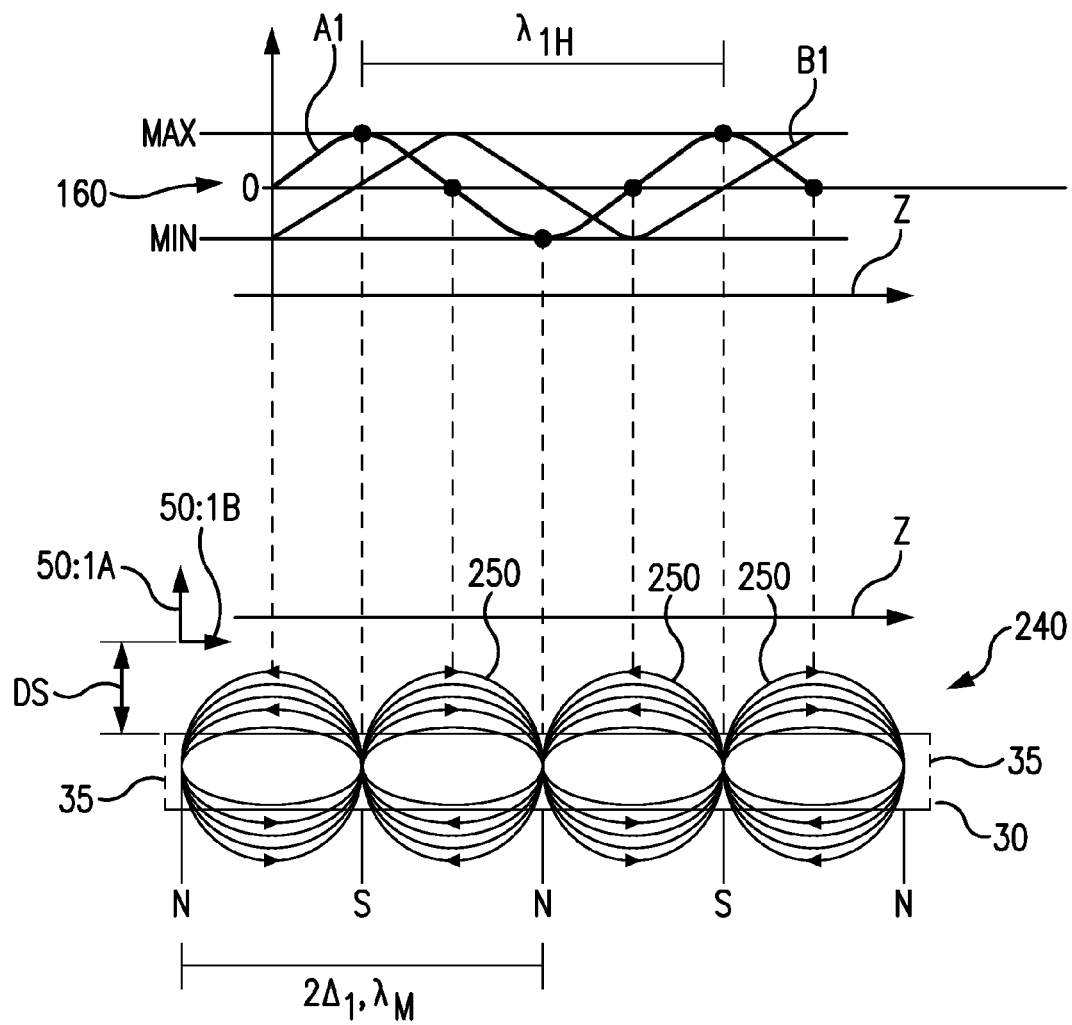
FIG. 6D schematically illustrates signal generation of a magnetic encoder according to an example embodiment of the present invention.

FIG. 6D is an illustration of the correlation between magnetic scale pattern 35 and the transducer output signals wave length in the case that the transducers 50:1A and 50:1B are Hall transducers.

With reference to FIG. 6D, the first lagged magneto-electric transducer (50:1B) and the first magneto-electric transducer (50:1A) may be Hall sensor transducers. One first wavelength ($\lambda_1$, $\lambda_{1MR}$, $\lambda_{1H}$) may then be generated by relative movement along the distance of the two first predetermined divisions ($\Delta_1$). According to example embodiments, the first lagged magneto-electric transducer (50:1B), having a direction of sensitivity, is positioned in geometrical proximity to the first magneto-electric transducer (50:1A), also having a direction of sensitivity, in which the first magneto-electric transducer (50:1A) and the first lagged magneto-electric transducer (50:1B) are arranged such that there is a geometrical angle between their respective directions of sensitivity. The first lag (PD) depends on the geometrical angle.

According to example embodiments, the geometrical angle is substantially ninety degrees. This renders the first lag (PD) of the magneto-electric transducer head to become a quarter wavelength irrespective of the first predetermined division ($\Delta_1$) distance, when Hall sensor transducers are used.

Figure 7A:
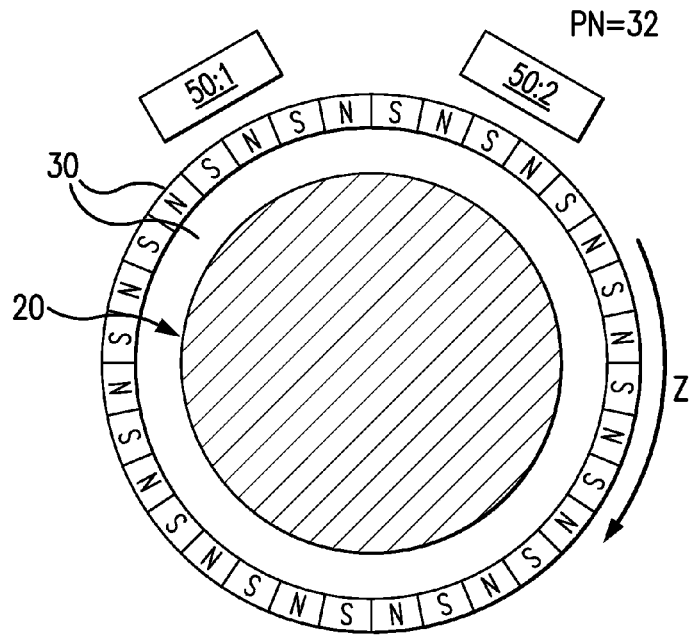
FIG. 7A schematically illustrates a perspective view of parts of an encoder system and a measurement object to which the encoder system is applied according to an example embodiment of the present invention.

FIG. 7A is an illustration showing an exemplary configuration of parts of an encoder system applied to a measurement object 20, such as a rotating shaft rotating axially in a direction Z.

As shown in FIG. 7A, a scale device 30, e.g., in the form of a magnetic encoding tape, may be applied circumferentially around the measurement object 20. The scale device 30 may be as described above, e.g., in connection with FIGS. 3A, 3B, and/or 3C. Hence, the scale device 30 includes a number of magnetic north and south poles, the magnetic north and south poles of the magnetic scale device being arranged in an alternating fashion in a circumferential direction. The magnetic north and south poles are further arranged at equidistant intervals of a predetermined distance, e.g., the first predetermined division $\Delta_1$. A first detector group 50:1 and a second detector group 50:2 may be arranged so that each of the two detector groups 50:1 and 50:2 are positioned above and substantially parallel to the scale device 30. The first and second detector groups 50:1, 50:2 may be arranged to sense the magnetic fields generated by the magnetic poles of the scale device as discussed with reference to FIG. 6A.

Each magnetic pole forms an increment so that when passed by a detector group (one of first detector group 50:1 and second detector group 50:2), a pulse can be generated, in which the incremental pulse indicates incremental shaft rotation, i.e., incremental rotation of the measurement object, as discussed in connection with FIGS. 6A and 6B.

In the illustrated example, with reference to FIG. 7A, the number of poles also referred to as pole number PN is 32. This means that PN increments may be generated for each revolution of the rotating shaft, when a magneto-resistive transducer is used. Hence, when PN=32, there will be 32 increments generated for each revolution of the rotating shaft when a magneto-resistive transducer is used. In case a Hall transducer is used, the number of increments would be PN/2 for each revolution of the rotating shaft. Hence, when PN=32, there will be 16 increments generated for each revolution of the rotating shaft when a Hall transducer is used.

It should be noted that the number of poles may be different compared to the illustrated example with reference to FIG. 7A. For example, fewer or more poles could be implemented by forming more or fewer magnetic alternating magnetic poles in the scale device. As an example, the number of poles could instead be in the range of 2 to 100,000, such as for example 1,024 or 2,048. The number of poles actually used in a scale device 30 may depend on application, shaft diameter and desired resolution to be achieved in the encoder output signal.

Figure 7B:
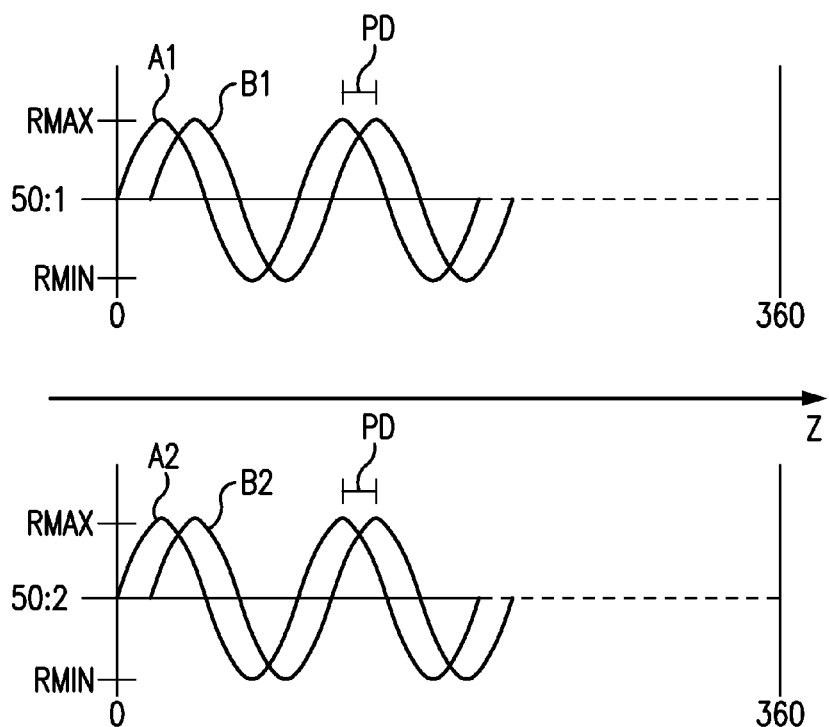
FIG. 7B schematically illustrates signal waveforms presented to the signal processing components of FIG. 2 and/or FIG. 5.

FIG. 7B is an illustration showing a signal generation resulting from detector groups 50:1, 50:2 passing over a moving scale device, such as that exemplified with reference to FIG. 7A.

As shown in FIG. 7B, waveforms in the form of sine and cosine signals are generated resulting from each of the detector groups passing over a scale device moving in a direction Z, such as illustrated with reference to FIG. 7A.

According to example embodiments, each of the first detector group 50:1 and second detector group 50:2 includes two magneto-resistive transducers. The first detector group may include a first transducer 50:1A adapted to generate a first electric signal A1 so that it oscillates in dependence on movement in the direction Z at a distance from the scale device 30, and a second transducer 50:1B may be adapted to generate a second electric signal B1 so that it oscillates in dependence on movement in the direction Z at a distance from the scale device 30. Examples of the waveforms of signals A1 and B1 are visible in the upper portion of FIG. 7B. The second transducer 50:1B is adapted to generate the second electric signal B1 at a lag in relation to the first electric signal A1. In other words, the first and second electric signals are generated such that there is a phase deviation PD between the first electric signal A1 and the second electric signal B1. The sign of the phase deviation PD may be indicative of the direction of movement of shaft 20.

The second detector group may include a third transducer 50:2A adapted to generate a third electric signal A2, and a fourth transducer 50:2B adapted to generate a fourth electric signal B2. Examples of the waveforms of signals A2 and B2 are illustrated in the lower portion of FIG. 7B.

As mentioned above, the first transducer and the second transducer of the first detector group are mutually configured so that there is a phase lag PD between the signals A1 and B1. According to example embodiments, the first electric signal A1 may substantially form a sine wave and the second electric signal B1 may substantially form a cosine signal. Hence, according to example embodiments:

$A1 = \sin(z)$, and $B1 = \cos(z)$, in which z represents the distance along the measuring path.

Hence, according to this example embodiment, the second electric signal B1 may be 90 degrees out of phase from the first electric signal A1. With reference to FIG. 7A in conjunction with FIG. 7B, it should be understood that when shaft 20 rotates clockwise (i.e., in the direction of the arrow Z) the phase deviation between signals A1 and B1 may be +90 degrees, and conversely, when the shaft 20 rotates counterclockwise (i.e., in the opposite direction of the arrow Z) the phase deviation between signals A1 and B1 may be −90 degrees. Hence, the sign (+ or −) of the phase deviation between signals A1 and B1 may be used for determining the direction of rotation of the shaft 20.

Accordingly, the second electric signal B1 may be a quadrature signal of the first electric signal A1. This may, for example, be achieved by configuring relative positioning or angular displacement between the first and second transducer of the first detector group.

In a similar fashion, the third signal A2 of the third transducer of the second detector group may substantially form a sine signal, and the fourth electric signal of the fourth transducer of the second detector group may substantially form a cosine signal. Hence, the fourth electric signal B2 may substantially be the quadrature signal of the third electric signal A2. This means that the phase difference PD both between the first and second electric signal and between the third and fourth electric signal is 90 degrees. Hence, according to an example embodiment:

$A2 = \sin(z)$, and $B2 = \cos(z)$, in which z represents the distance along the measuring path.

Accordingly, the sign (+ or −) of the phase deviation between signals A2 and B2 may also be used for determining the direction of rotation of the shaft 20.

Figure 7C:
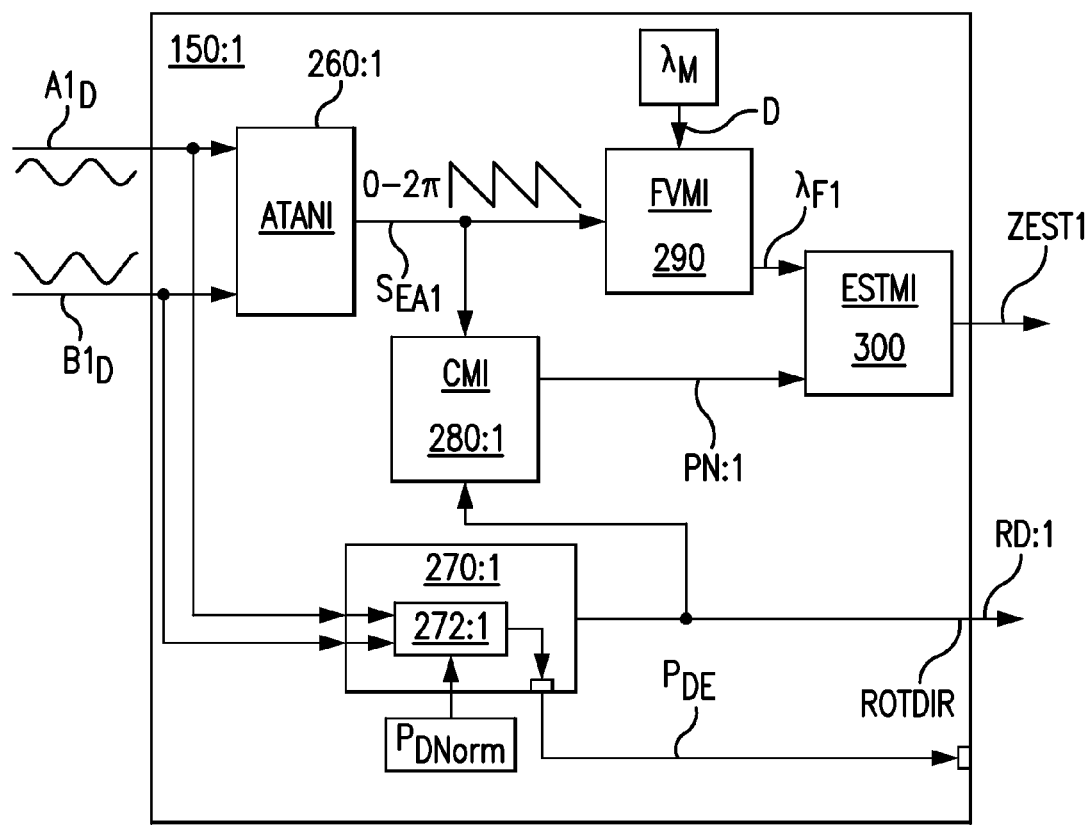
FIG. 7C schematically illustrates a block diagram of a signal interpreter according to an example embodiment of the present invention.

FIG. 7C is an illustration showing a block diagram of the first signal interpreter 150:1.

With reference to FIG. 5 and as shown in FIG. 7C, the signals $A1_D$ and $B1_D$ in the form of a sine and a cosine signal from the first detector group 50:1, such as exemplified in FIG. 7A, 7B, are fed into the signal interpreter 150:1 associated to the first detector group.

According to example embodiments, the signal interpreter 150:1 includes an arctan function generator module 260:1 arranged to process the $A1_D$ and $B1_D$ signals by performing an arctan calculation function. The output value $S_{EA}$ generated by the arctan function generator module 260:1 may represent an electrical angle (EA), i.e., a value progressing from zero to 2Π in dependence on signals $A1_D$ and $B1_D$. Hence, with reference to FIG. 6A or 6B in conjunction with FIG. 7B, the output signal $S_{EA1}$ from indicates the relative position of the transducer 50:1A signal within one wave length λ1.

The signal interpreter further includes a rotational direction detector module 270:1, RDM arranged to detect the rotational direction of the scale device. The rotational direction detector module 270:1 may be arranged to detect the current direction of rotation (clockwise, counterclockwise) in dependence on a detected phase relation between the A1 and B1 signal. According to example embodiments, when the second electric signal $B1_D$ is a quadrature signal of the first electric signal $A1_D$, the rotational direction detector module 270:1 may be arranged to detect the sign (+ or −) of the phase deviation between signals $A1_D$ and $B1_D$, so as to generate an output signal RD1 which may be indicative of the rotational direction of the shaft 20.

According to example embodiments, the rotational direction detector module 270:1 includes a phase deviation analyzer 272:1 having inputs for receiving the signals $A1_D$ and $B1_D$. The phase deviation analyzer 272:1 may be adapted to establish a value $PD_{EST1}$ indicative of the current phase deviation between signals $A1_D$ and $B1_D$. The analyzer may also have an input for receiving at least two values indicative of "Normal" phase deviation $PD_{NORM}$. When the signals $A1_D$ and $B1_D$, are quadrature signals, the "Normal" phase deviation $PD_{NORM}$ values may be, e.g., +90 degrees and −90 degrees, respectively, each value corresponding to one of the two rotational directions of shaft 20.

The phase deviation analyzer 272:1 may be adapted to compare the established value $PD_{EST1}$ with the two values indicative of "Normal" phase deviation $PD_{NORM}$. When the comparison indicates that the established value $PD_{EST1}$ substantially corresponds to one of the two values indicative of "Normal" phase deviation $PD_{NORM}$, this in interpreted to indicate that the corresponding detector head 50:1 is positioned above the scale pattern 35.

When the comparison, performed by phase deviation analyzer 272:1, indicates that the established value $PD_{EST1}$ deviates from both of the two values indicative of a "Normal" phase deviation $PD_{NORM}$ the phase deviation analyzer 272:1 may be adapted to generate a phase error signal PDE1. This signal may be used for detecting a scale edge, as discussed in connection with FIG. 8B below.

An example embodiment of scale edge detection is described below.

With reference to FIG. 7C, the phase error signal PDE1, generated by the phase deviation analyzer 272:1, may be used an indication to the effect that the detector head 50:1 is positioned above the scale pattern 35. Hence, the position Z at which the phase error signal PDE1 occurs may indicate that the detector head 50:1 is passing a scale edge at that position. Hence the occurrence of the phase error signal PDE1 may indicate that detector head 50:1 is just entering a gap in the scale at that position Z. Hence, the phase error signal PDE1 switching from "No phase error" to "Phase error indication" may indicate that detector head 50:1 is just entering a gap in the scale at that position Z.

When that occurs, the encoder may be adapted to store that position value Z, i.e., the position value Z generated by 220, as a scale end edge position value ZSE:1 for detector head 50:1.

Similarly, when the phase error signal PDE1 switches from "Phase error indication" to "No phase error" this may indicate a position Z at which the detector head 50:1 has just passed scale start edge, i.e., the detector head 50:1 is just beginning to read the magnetic field pattern 240 caused by the scale pattern 35. Thus, when the phase error signal PDE1 switches from "Phase error indication" to "No phase error" this may indicate that detector head 50:1 has just left the gap 340 and entered the region of the scale pattern 35.

The signal interpreter 150:1 further includes a counter module 280:1 which may be arranged to count the number of rising or falling edges appearing on the signal SEA:1 delivered by the arctan function generator 260:1. The resulting count value PN of counted rising or falling edges may be indicative of the number poles of the scale device the first detector group has passed, since the last reset of the counter module 280:1. Hence, the output signal PN delivered by counter module 280:1 may deliver the value PN, as discussed above in relation to FIG. 7A.

The counter module 280:1 may further be arranged to receive information relating to rotational direction from the rotational direction module 270:1 so as to allow the counter module 280:1 to handle both rotational direction that is clockwise and counter clockwise, e.g., by increasing the counter value PN in response to clockwise rotation of the shaft 20 and decreasing the counter value PN in response to counterclockwise rotation of the shaft 20 (See FIG. 7C in conjunction with FIG. 7A and FIG. 1).

The signal interpreter 150:1 further includes a memory portion 285, which may be referred to as a wavelength storage module λM. The wavelength storage module may be arranged to store a parameter D corresponding to the physical wavelength of a magnetic pole element. With reference to the discussion in connection with FIGS. 6A, 6B and 3C, the wavelength storage module λM may adapted to deliver information D indicative of the relation between the first predetermined division $\Delta_1$ and the first predetermined wavelength $\lambda_1$. According to an embodiment, the information D may have the dimension mm/(degree of electrical angle EA).

The wavelength storage module λM may be connected to a fractional distance value module 290, which may be arranged to process the value $S_{EA}$ delivered by the arctan function generator module 260:1 and the parameter D provided by the wavelength storage module.

The fractional distance value module 290 may be arranged to multiply the parameter D with the latest received value SEA:1, delivered by the arctan function generator 260:1, so that a fractional lambda value $\lambda_{F1}$ is generated, in which the fractional lambda value $\lambda_{F1}$ may represent the current physical distance within one wavelength. Hence, for example, if MR transducers are used, we may refer to FIG. 6A: If the first predetermined division $\Delta_1$ is 5 mm, and the current value $S_{EA1}$=Π or 180 degrees, then the value D will be 5 mm/λ1, and the fractional lambda value $\lambda_{F1}$ delivered by the fractional distance value module 290 may represent 2.5 mm, i.e., half of the physical distance $\Delta_1$.

The signal interpreter 150:1 may further include a position estimation module 300 arranged to produce a first estimate $Z_{EST1}$ of the current position of the scale device 30 in relation to the detector device 50 (See FIG. 1 in conjunction with FIG. 7A and FIG. 7C). The position estimation module 300 may be arranged to generate the first estimate $Z_{EST1}$ of the current position in dependence on the fractional lambda value $\lambda_{F1}$ from fractional distance value module 290 and the count value PN received from the counter module 280:1.

With reference to FIG. 5 and FIG. 7C, the second signal interpreter 150:2 may operate in the same manner as described for the first signal interpreter 150:1.

Hence, the second signal interpreter 150:2 may include a position estimation module 300:2 arranged to produce a second estimate $Z_{EST2}$ of the current position of the scale device 30 in relation to the detector device 50 in dependence on the $A2_D$ and $B2_D$ signals (See FIG. 5 in conjunction with FIGS. 1, 7A and FIG. 7C).

The second signal interpreter 150:2 may also include a rotational direction detector module 270:2 which may be arranged to detect the current direction of rotation (clockwise, counterclockwise) in dependence on a detected phase relation between the A2 and B2 signal. According to example embodiments, when the electric signal $B2_D$ is a quadrature signal of the electric signal $A2_D$, the rotational direction detector module 270:2 may be arranged to detect the sign (+ or −) of the phase deviation between signals $A2_D$ and $B2_D$, so as to generate an output signal RD2 which may be indicative of the rotational direction of the shaft 20.

Moreover, the second signal interpreter 150:2 may also include a phase deviation analyzer 272:2 corresponding to the phase deviation analyzer 272:1 as described above.

Figure 7D:
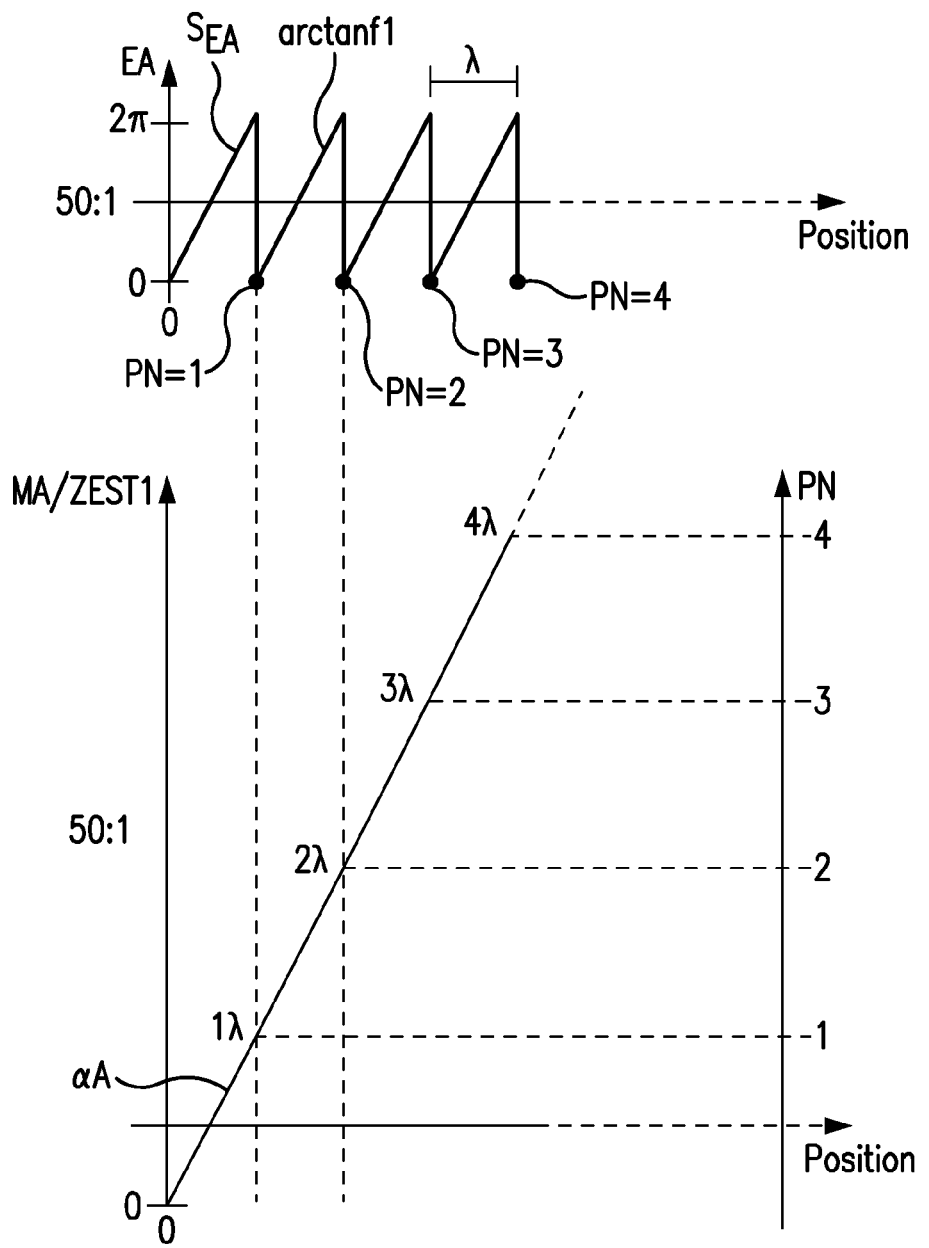
FIG. 7D schematically illustrates generation of a position estimation signal according to an example embodiment of the present invention.

FIG. 7D is an illustration showing processing of signals, generated resulting from the one of the detector groups passing over a moving scale device such as described with reference to FIG. 7A.

As shown in the upper portion of FIG. 7D, a waveform acrtanf1 is generated by processing the electric signals A1 and B1 generated by the first detector group, as described with reference to FIG. 7B. The processing may be performed by the processing device 100, as illustrated with reference to FIG. 2 and/or FIGS. 4 and 5.

According to example embodiments, the first A1 and second B1 electric signals generated by the first detector group 50:1 are processed by using an arctan according to equation 1 below.

$$\tan^{-1}\left(\frac{A1}{B1}\right)$$

By processing the arctan function as described above, an electrical angle value EA, $S_{EA}$ can be derived. Hence, a current value of the variable $S_{EA}$ is indicative of the position within each pole. The electrical angle value $S_{EA}$ starts from 0 and progresses to 2π for each pole or λ, as discussed above.

As shown in the lower portion of FIG. 7D, a modified waveform αA is provided by processing the waveform arctanf1. The waveform αA is indicative of the mechanical angle, e.g., estimated position $Z_{EST1}$ EP of the measurement object, such as the incremental rotation of the shaft 20 illustrated with reference to FIG. 7A. The progression of pole number PN is indicated to the right in the lower portion of FIG. 7D and the estimated position is indicated to the left in the lower portion of FIG. 7D.

The waveforms or third and fourth electric signals A2, B2 may be processed in a similar fashion to the first and second electric signals as explained above in order to derive an electrical angle and a mechanical angle.

Figure 7E:
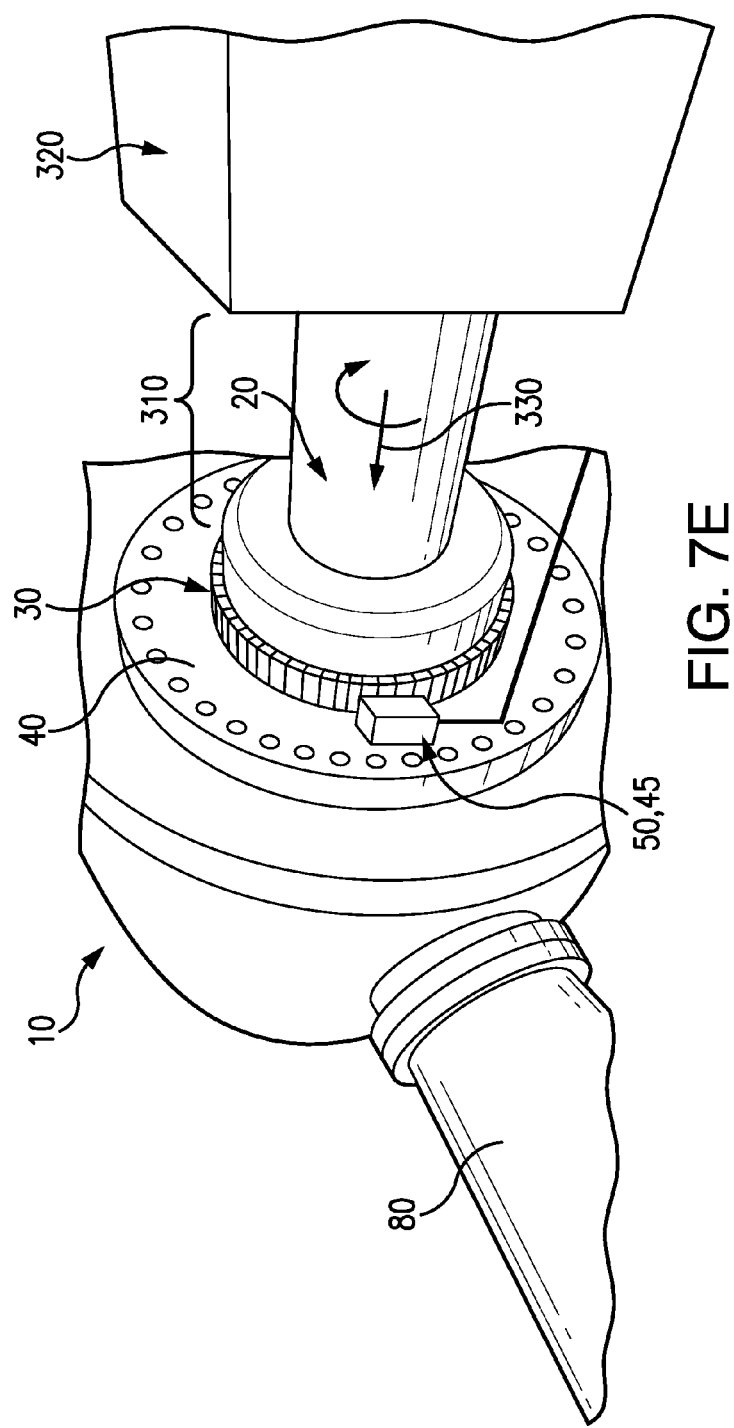
FIG. 7E schematically illustrates another perspective view of an encoder system and parts of a machine to which the encoder system is applied according to an example embodiment of the present invention.

FIG. 7E is a block diagram illustrating another machine 10, as compared to the machine illustrated in FIG. 1. Certain machines 10, having a shaft 20, may have a shaft portion 310 which is positioned such that it is difficult or even impossible to place anything around that shaft portion 310 from an end of the shaft 20. In other words, the configuration of the machine 10 may be such that threading a unitary circular scale device 30 (See FIG. 7A in conjunction with FIG. 7E and FIG. 1) into a desired position may be prevented by a machine part. With reference to FIG. 7E, the length of the shaft 20 may stretch from the one machine part 40 to another machine part 320, in which the first and second machine parts 40, 320 are shaped and dimensioned so that threading, e.g., a band, shaped as a single-piece closed circle, over the first or second machine parts 40, 320 is impossible. Hence, when it is desired to measure and detect the position and/or rotational movement of the shaft 20, it may not be possible to attach a single-piece circular magnetic scale at the shaft portion 310. Additionally, the amount of space, in the direction of the axis of rotation 330 of the shaft 20, may be limited. Hence the physical reality of the machine may require the width of the scale device 30 to be small.

The machine 10 may be arranged as a wind power station 10, as illustrated in FIGS. 1 and 7E. Hence, the shaft 20, of the wind power station 10, may be attached to one or more turbine/rotor blades 80 adapted to cause rotation of the shaft 20 in response to air movement caused by wind so as to generate electric power by a generator 70 coupled to the shaft 20. In connection with maintenance work on some machines, such as wind power station 10, it may be necessary to obtain not only information about relative position, but information about an absolute position of the shaft 20. For instance, it may be necessary to stop the wind power station from operation by introducing a lock bolt, or similar into a corresponding bolt receptor in the shaft so as to lock the shaft in a certain position. In order to be able to introduce the lock bolt, it may be necessary to position the shaft so that the bolt receptor faces the position of the lock bolt.

Hence, there is a need to achieve an encoder 90 capable of delivering an absolute position, while also being capable of being mounted so that it requires a very limited amount of space. Moreover, it may be needed to make it possible to install the encoder 90, even when first and second machine parts 40, 320 are shaped and dimensioned so that threading, e.g., a band, shaped as a single-piece closed circle, over the first or second machine parts 40, 320 is impossible.

According to example embodiments, the scale device 30 may be dividable so as to allow it to be placed at shaft positions such as shaft portion 310. According to example embodiments, the scale device 30 may then also be provided with a gap portion 340.

According to example embodiments, the scale device 30 may be made of a flexible band, such as, e.g., a bendable steel band, provided with an openable locking device so as to allow the flexible band to be opened such that it may be placed at a desired measuring path position on the shaft 20. When positioned at the desired measuring path position on the shaft 20, the locking device of the flexible scale band 30 may be closed and locked so as to attach it to the desired measuring path position on the shaft 20. The locking device may then be used as the gap portion 340 of the scale device 30.

According to example embodiments, the scale device 30 may include a dividable scale ring. The inner diameter of the dividable ring may substantially correspond to the outer diameter of a shaft 20 to which the dividable scale ring 30 is intended to be attached. The dividable scale ring 30 may then have at least two openings so as to allow the ring to be divided in at least two parts. Hence, an opening of the dividable scale ring 30 may be provided with an openable locking device so as to allow the dividable scale ring 30 to be opened such that it may be placed at a desired measuring path position on the shaft 20. When positioned at the desired measuring path position on the shaft 20, the locking device of the dividable scale ring 30 may be closed and locked so as to attach it to the desired measuring path position on the shaft 20. The locking device may then be used as the gap portion 340 of the scale device 30.

Figure 8A:
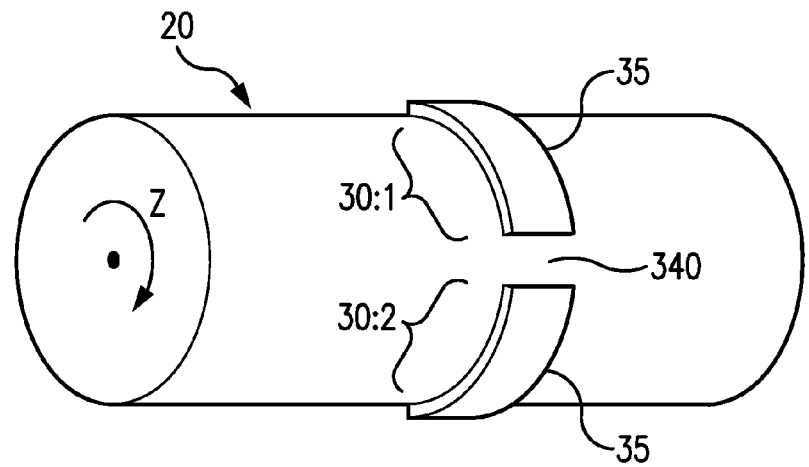
FIG. 8A schematically illustrates a scale device applied having a gap wherein the scale device is applied to a measurement object according to an example embodiment of the present invention.

FIG. 8A illustrates a magnetic scale device 30 when attached around the perimeter of a shaft 20. As illustrated by FIG. 8A, the magnetic scale device 30 includes at least one gap 340 in the magnetic scale pattern 35, when the magnetic scale device 30 is attached around the perimeter of a shaft 20. Hence, whereas the magnetic scale pattern 35 displays a plurality of successive equidistant magnetic pole elements 120, the scale gap portion 340 of the scale device 30 may lack magnetic pole elements. Alternatively, the scale gap portion 340 of the scale device 30 may be arranged so as to exhibit a second predetermined wavelength $\lambda_2$ differing from the first predetermined wavelength $\lambda_1$. This may be achieved by providing pole elements with a second predetermined division $\Delta_2$ differing from the first predetermined division $\Delta_1$.

The magnetic scale device 30, as illustrated in FIG. 8A, may include a single magnetic scale pattern 35 forming a single magnetic track along the measuring path Z circumscribing the shaft 20.

Detector switch resulting from gap passage is described below.

Figure 8B:
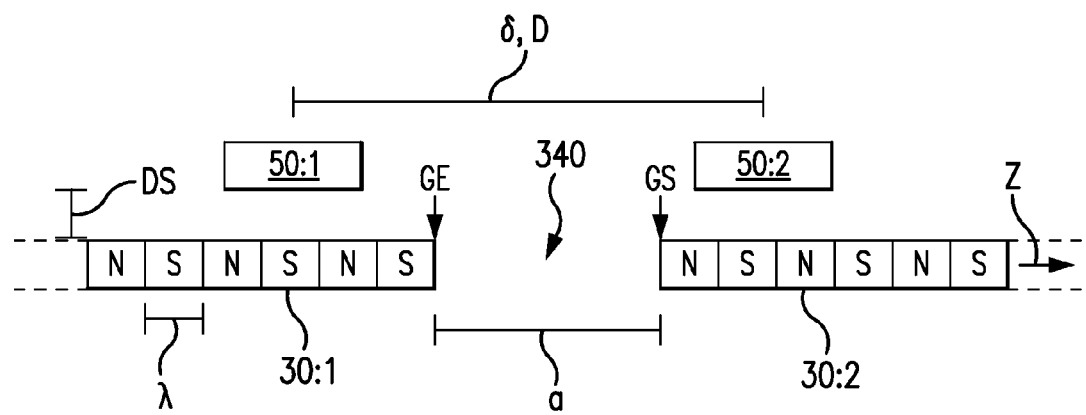
FIG. 8B schematically illustrates a process of switching between two detector groups in response to passage of a gap in the scale device according to an example embodiment of the present invention.

FIG. 8B is an illustration showing a gap passage with associated switching of output signals from detector groups.

As shown in FIG. 8B, the first and second detector groups 50:1, 50:2 pass a gap 340 formed between two portions 30:1, 30:2 of a scale device as a result of a measurement object to which the scale device is attached travels in a direction Z. The detector groups are arranged at a distance d from the scale device. The detector groups are adjacently arranged at a distance δ from each other. The distance δ is arranged to be larger than the gap distance a, i.e., distance covered by the gap, such that one of the detector groups always is positioned outside the gap 340. The scale device is a magnetic scale device such as a magnetic encoding tape having a number of equidistant magnetic poles in the form of alternating north and south poles. Each pair of successive north and south poles together form a wavelength λ.

According to example embodiments, both the first detector group 50:1 and the second detector group 50:2 are arranged to continuously generate at least one output signal in the form of signal pairs signal pair A1B1 and signal pair A2B2 respectively to a signal processing device, such as the signal processing described with reference to FIGS. 2 and/or 5. In response to receiving the at least one output signal from the two detector groups, the signal processing device is arranged to determine which of the signal pairs A1B1 and A2B2 to use as basis for generating an estimated position signal to be presented to an output, such as the output signal generation device described with reference to FIG. 5. In order to determine which of the detector groups to use as basis for estimating a position signal, information relating to direction of movement of the scale device relative the detector groups, as determined by the phase difference between the signals within at least one of first and second signal pairs A1B1, A2B2 is used. In more detail, the sequence in which the detector groups pass the gap is used to determine which of the detector groups to use as basis for estimating a position signal, in which the sequence in which the detector groups pass the gap is determined by the direction of movement of the scale device. As a default, the detector group determined to be second in sequence to pass the gap is used as basis for generating a position estimation signal. When the detector group first in sequence to pass the gap has passed the entire distance of the gap a switch is made from using the detector group second in sequence to pass the gap, i.e., from the detector group not having passed the gap to using detector group first in sequence to pass the gap, i.e., the detector group having passed the entire distance of the gap. When the detector group second in sequence to pass the gap has passed the entire distance of the gap a switch from the detector group first in sequence to pass the gap to the detector group second in sequence to pass the gap is performed.

As an example with further reference to FIG. 8B, the first and second detector groups is connected to a stationary part of the measurement object so that the detector groups remains stationary. The scale device in the form of at least two sections 35:1, 35:2 of the scale device is attached to a moving part of the measurement object, such as circumferentially attached to a shaft as illustrated in FIG. 1, 7A or 8A, so that the scale device moves together with the moving part of the measurement object. This means that the scale device moves relative to the detector groups whereby the detector groups is configured to determine a position of the moving part of the measurement object based on sensing the movement of the scale device. In this example, the scale device in the form of two sections 35:1, 35:2 moves in a direction Z. In order to sense the movement of the scale device, each of the detector groups includes at least two magnetic sensors, such as at least two MR sensors, operable to sense changes in magnetic field generated by the moving scale device in the form of a magnetic scale device, including a plurality of equidistant magnetic north and south poles. The magnetic north and south poles are arranged in an alternating pattern along the extension of the scale device.

Since the gap of the scale device includes no scale marking elements, e.g., magnetic north and south poles, a detector group positioned above the gap will not be able to generate an output signal suitable for use as basis for generating a position estimation signal. However, since at least one of the first and second detector groups always is positioned above the scale device outside the gap, at least one of the first and second detector groups will always produce a signal suitable to use as basis for generating a position estimation signal.

In this example, in case none of the detector groups have passed the gap, the first detector group will pass over the gap before the second detector group will pass over the gap. In more detail, since the scale device in this example move in a direction Z relative to the stationary detector groups, the first detector group will be first in sequence to pass over the gap and the second detector group will be second in sequence to pass over the gap.

This means that provided the movement of the scale device as indicated by the direction Z as illustrated in FIG. 8B, the first detector group will lose the possibility of generating an output signal suitable for use as basis in order to provide a position estimation when passing over the gap.

In cases where the movement of the scale device is opposite to the direction Z, the gap start position and gap end position will switch place as compared to the illustrated example with reference to FIG. 8B. In more detail, the gap start position will be the gap end position as illustrated in FIG. 8B, and the gap end position will be the gap start position as illustrated in FIG. 8B. This means that the second detector group will be first in sequence to pass over the gap and that the first detector group will be the second in sequence to pass over the gap.

In order to determine which of the first and second detector groups that are first and second in sequence to pass over the gap the phase difference as explained above is used. For example, the detected phase difference will determine if the scale device moves in the direction Z or in a direction opposite to Z.

According to example embodiments, at least one gap end position signal generated in response to at least one of the detector groups reaching a gap end position GE. According to this example embodiment, the gap end position signal is used to determine when to switch between the two detector groups.

According to example embodiments, at least one gap start position signal generated in response to at least one of the detector groups reaching a gap start position GS.

Information relating to gap distance is described below.

According to example embodiments, both at least one gap start position signal and at least one gap end position signal are generated. According to this example embodiment, both the at least one gap start signal and the at least one gap end signal is used to determine when to switch between the two detector groups.

According to example embodiments, information relating to gap position, i.e., information defining where on the scale device the gap is positioned is used to determine when to switch between the two detector groups. The gap position information may be predetermined or determined during a first gap passage.

Handling of stop/switch of direction when a detector group is positioned above the gap is described below.

Figure 8C:
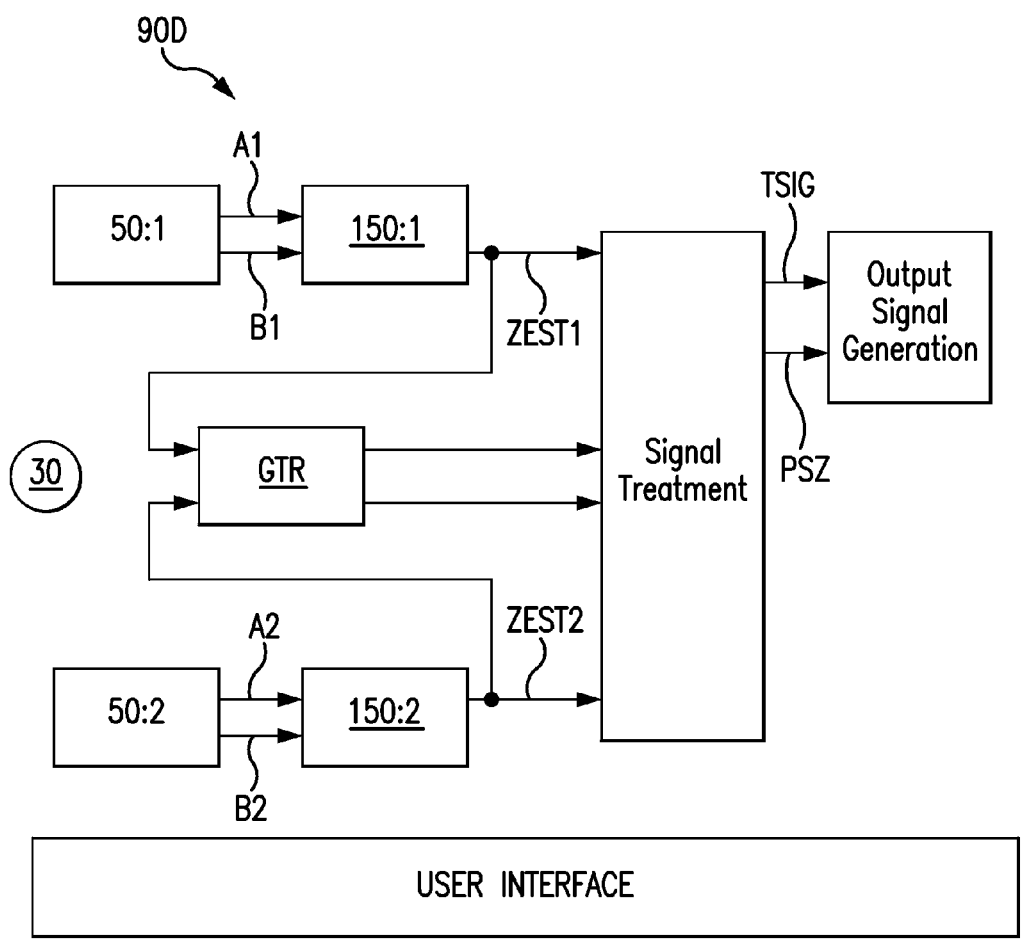
FIG. 8C schematically illustrates a block diagram of an encoder system according to an example embodiment of the present invention.

FIG. 8C is a block diagram illustrating another example embodiment 90D of the system 90 for detecting movement and/or position of a rotatable shaft, such as the shaft 20 of FIG. 1.

Figure 8D:
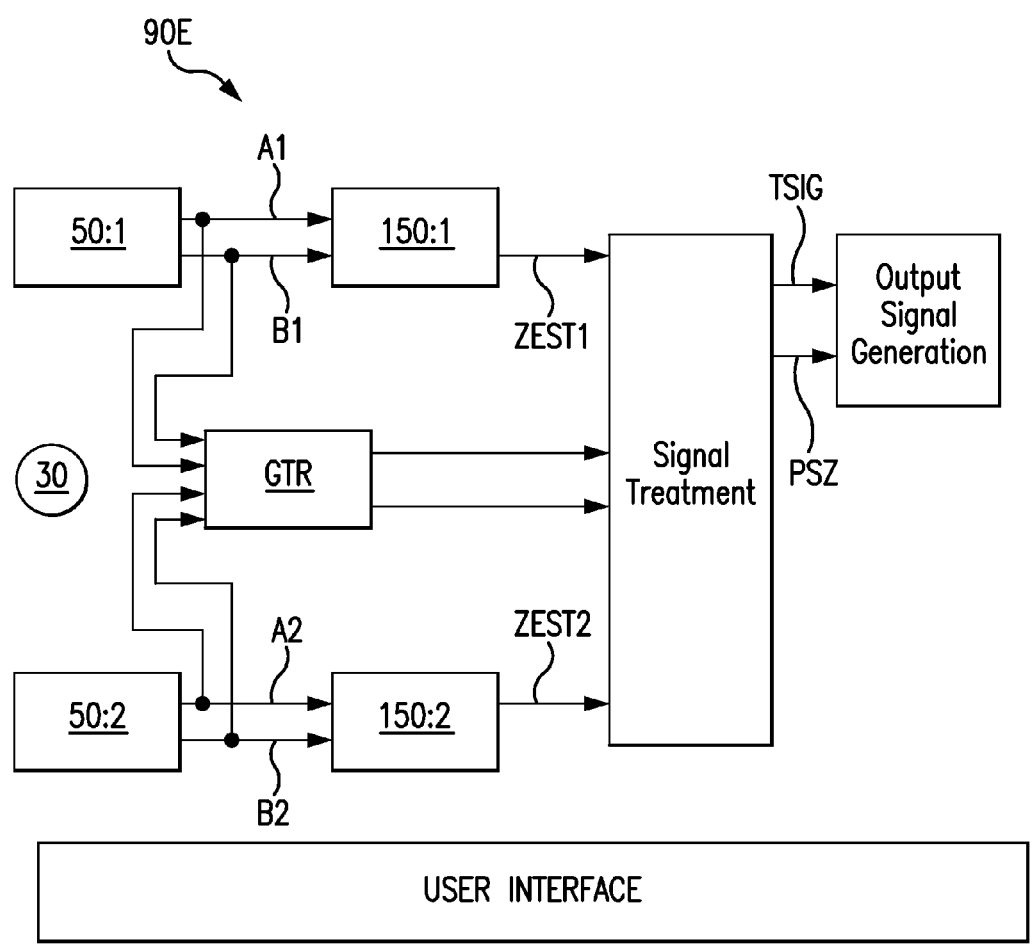
FIG. 8D schematically illustrates a block diagram of an encoder system according to an example embodiment of the present invention.

FIG. 8D is a block diagram illustrating another example embodiment 90E of the system 90 for detecting movement and/or position of a rotatable shaft, such as the shaft 20 of FIG. 1.

Figure 9A:
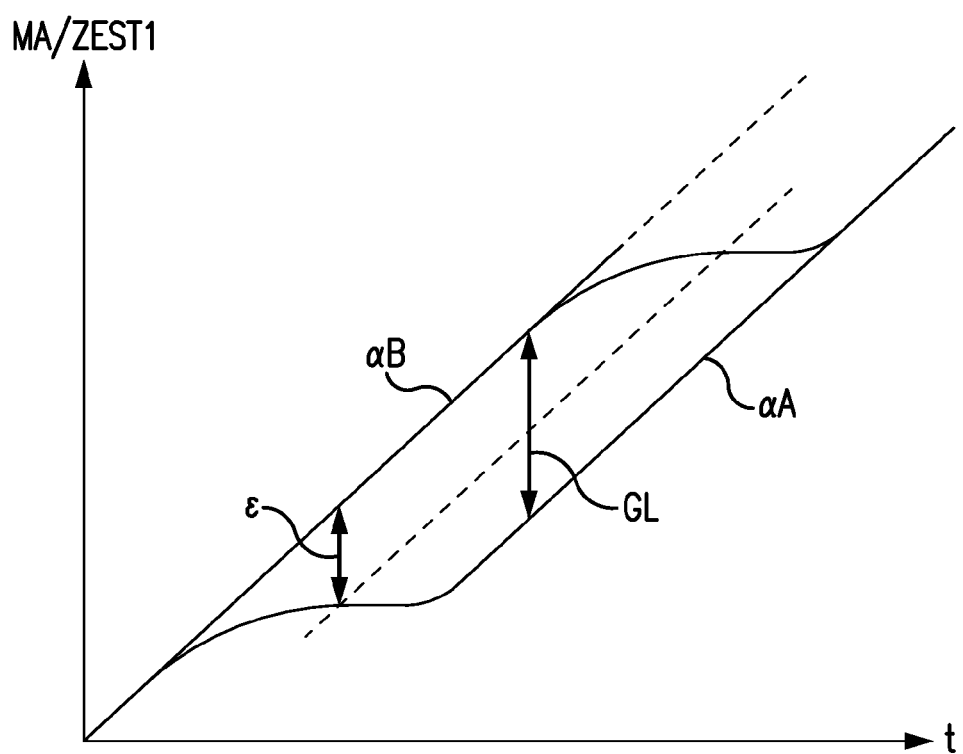
FIG. 9A is an illustration showing how gap detection is performed by the encoder system according to an example embodiment of the present invention.

FIG. 9A is an illustration showing how gap detection is performed by the encoder system.

As shown in FIG. 9A, two signals $\alpha A$, $\alpha B$ in the form of processed output signals from the first and second detector groups are generated. The signals $\alpha A$, $\alpha B$ correspond to processed signals from the first and second detector groups 50:1 and 50:2, in which $\alpha A$ is the signal resulting from processing the output of the first detector group 50:1 and $\alpha B$ is the signal resulting from processing the output of the second detector group 50:2.

$\epsilon$ denotes a threshold level for determining a deviation corresponding to a detected gap. In example embodiments, $\epsilon$ is determined to be half the length of the gap, e.g., half the length a of the gap 340 as described with reference to FIG. 8B.

Figure 9B:
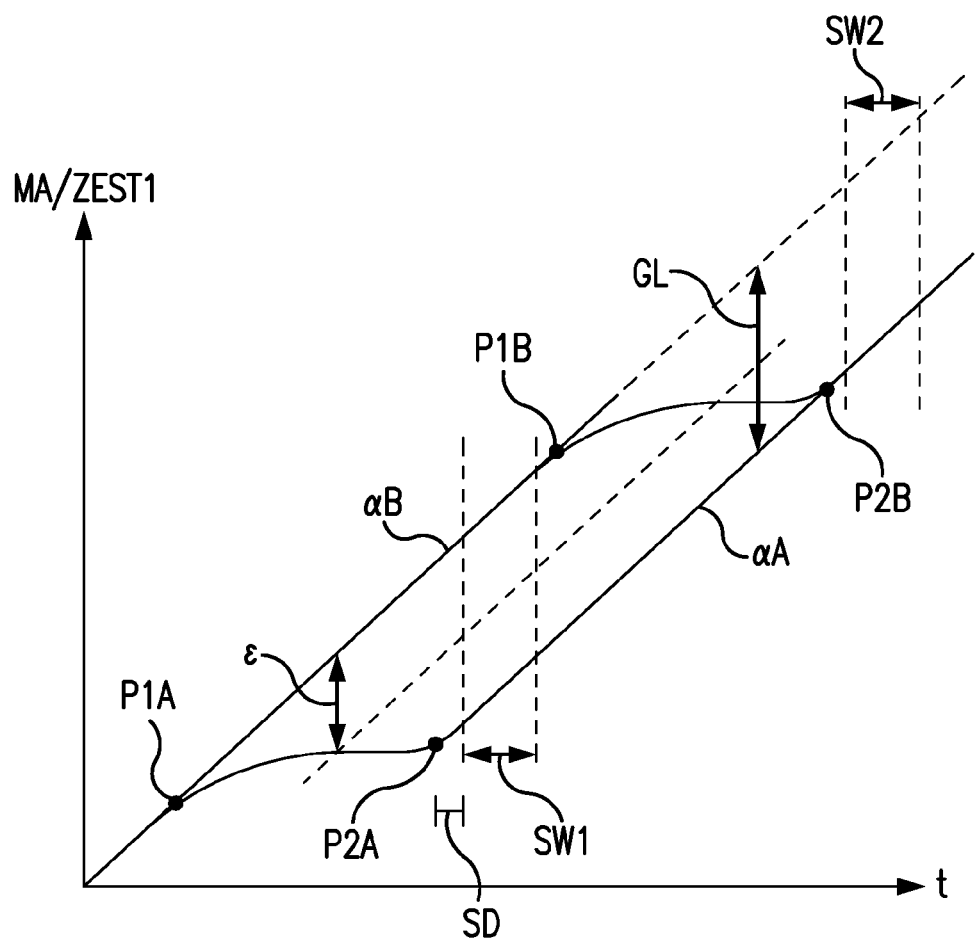
FIG. 9B is an illustration showing an implementation of synchronization associated to switching between the two detector groups.

FIG. 9B is an illustration showing an implementation of synchronization associated to switching between the two detector groups.

As shown in FIG. 9B, switching takes place two times for each gap passage.

P1A denotes a position in which the first detector group passes over a gap. P1B denotes a position wherein the first detector group has passed the gap.

P2A denotes a position wherein the second detector group passes over a gap. P2B denotes a position wherein the second detector group has passed the gap.

Figure 9C:
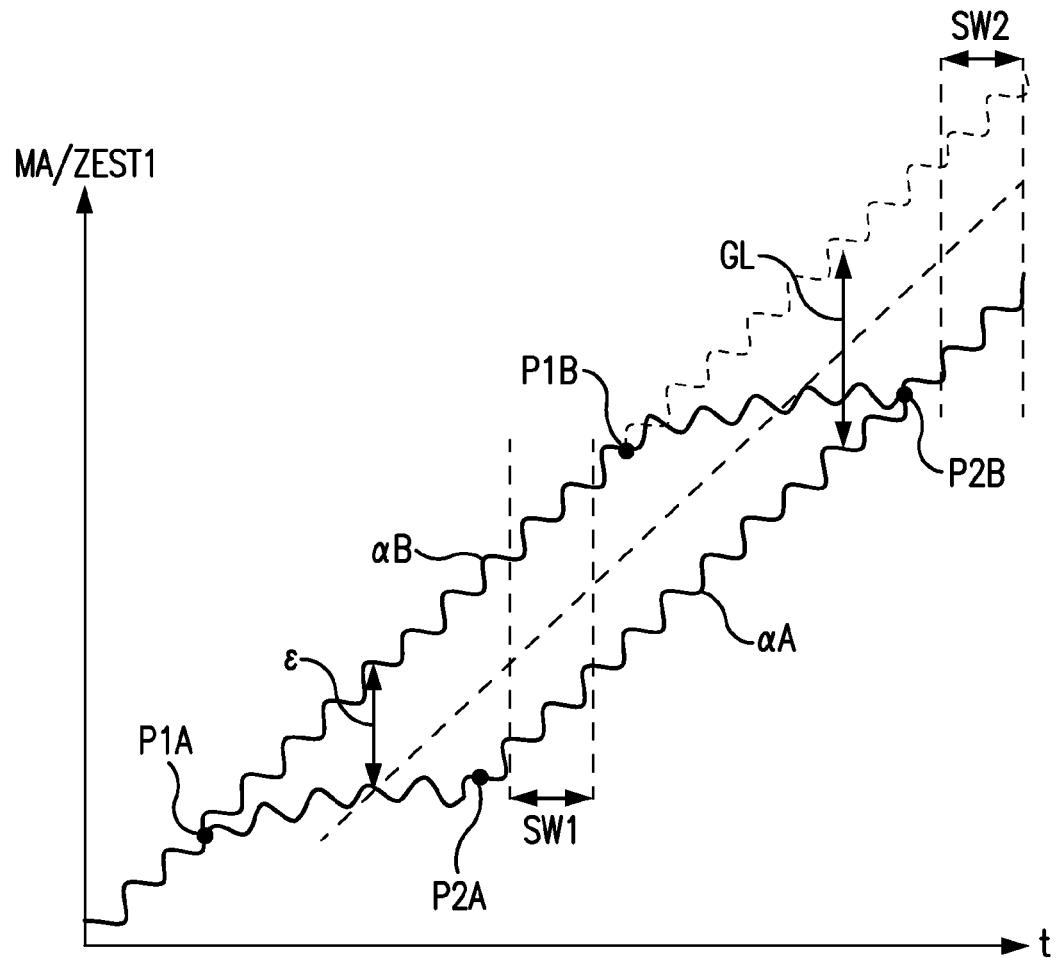
FIG. 9C is an illustration showing another implementation of synchronization associated to switching between the two detector groups.

FIG. 9C is an illustration showing an implementation of synchronization associated to switching between the two detector groups.

It is sometimes desirable to generate a reference pulse, at least once per shaft revolution, so that it indicates an absolute position of the shaft 20 with a very small degree of inaccuracy. However, at least some portions of the length of a scale device 30 being attached on a shaft may "float" in relation to the shaft, e.g., as a result of temperature fluctuations. Hence, unfortunately, if the reference pulse is generated in direct dependence on a position of the scale device 30 that "floats," the position indicated by that reference pulse may also "float" in relation to the shaft, rendering a somewhat less accurate position indication.

Figure 10A:
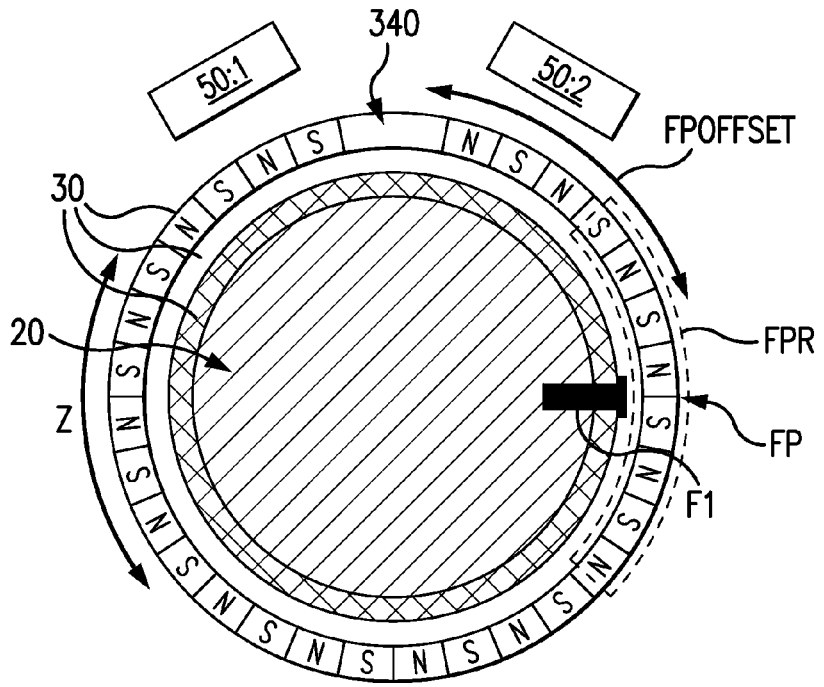
FIG. 10A schematically illustrates a cross-sectional view of a scale device with a fixpoint or fixpoint region applied to a measurement object according to an example embodiment of the present invention.

FIG. 10A is an illustration showing an implementation of a generation of a reference pulse according to an example embodiment of the present invention.

As shown in FIG. 10A, at least one fastening element F1, such as a screw, is used to firmly attach the scale device 30 to the measurement object 20 at a position FP of the scale device 30.

According to example embodiments, at least one fixpoint position FP may be implemented. The fixpoint is used as a fixed reference position to indicate a reference position on the scale device. The reference position may be used to generate one reference pulse per revolution of the measurement object. Accordingly, whenever a reference pulse may be generated indicating that the measurement object is known to be at a particular position relative the detector groups.

By implementing a fixpoint it is possible to generate a reference pulse/null pulse once per shaft revolution so that the shaft position indicated by the reference pulse truly indicates the actual position of the shaft, despite the fact that parts of the scale device/ring 30 will "float" in relation to the shaft in dependence on temperature variations.

The fixpoint may, for example, be a position and/or portion of the scale device, where the scale device is firmly coupled to the measurement object. As an example, the fixpoint may be a point FP and/or region FPR of the scale device located at and/or near a fastening element F1 securing the scale device to the measurement object. For example, the fixpoint may be positioned near and/or at a fastening element F1 such as a screw other suitable fastening element F1, arranged to fasten the scale device to the measurement object.

The fixpoint or fixpoint region is located at a predetermined distance FPOFFSET from a gap 340.

Figure 10B:
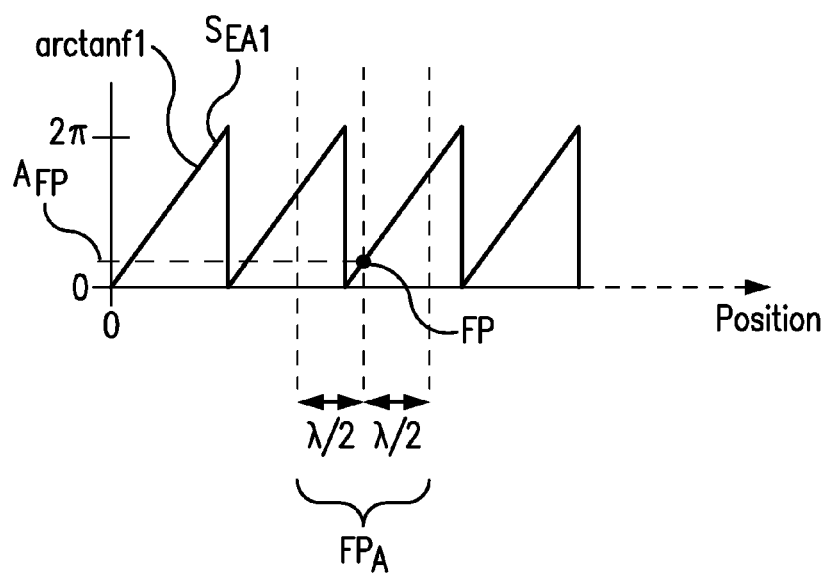
FIG. 10B schematically illustrates a waveform used for generating a reference pulse according to an example embodiment of the present invention.

FIG. 10B is an illustration showing an implementation of a generation of a reference pulse, based on using the fixpoint, such as described with reference to FIG. 10A, according to an example embodiment of the present invention.

Figure 11:
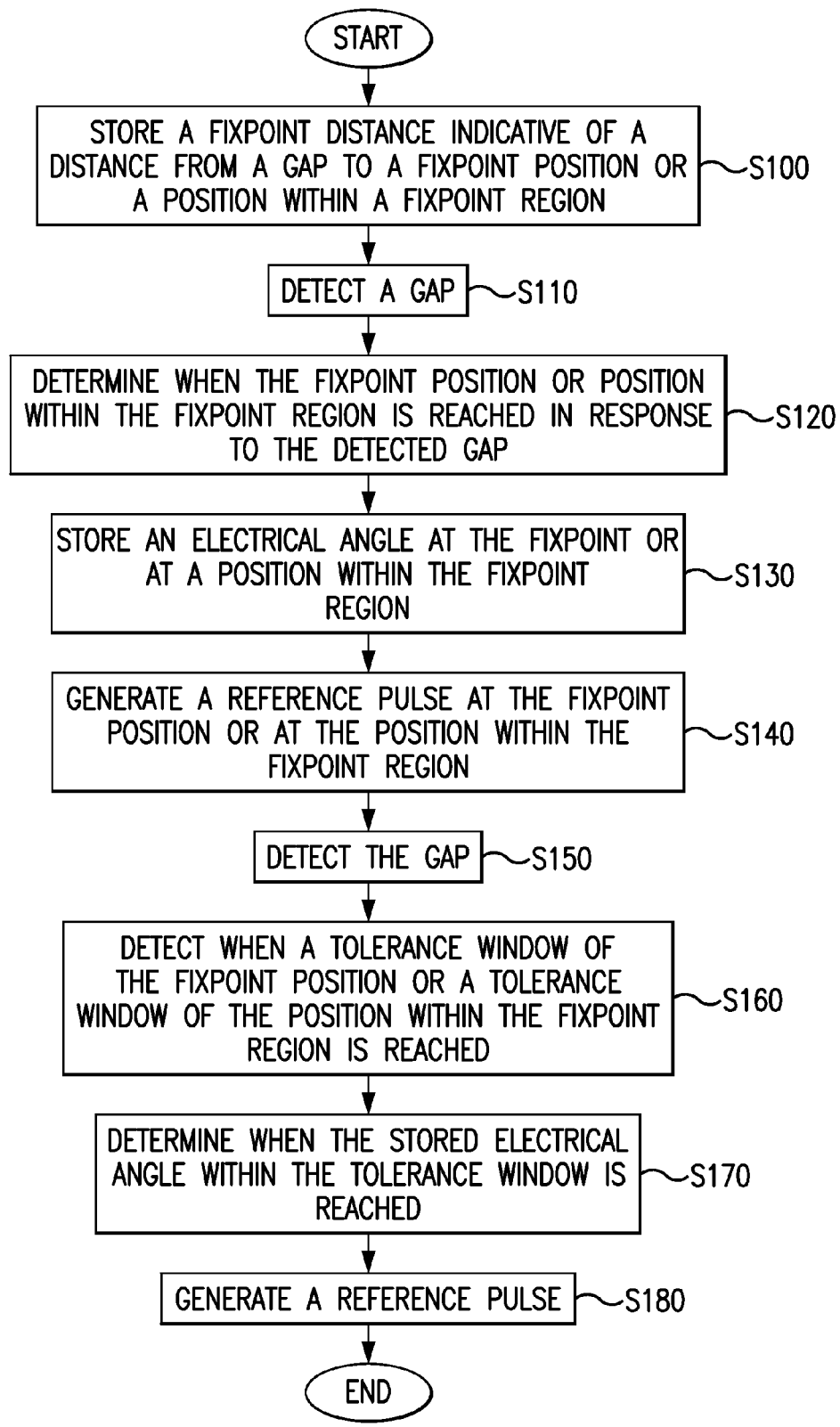
FIG. 11 schematically illustrates a flow chart of a method for generating a reference pulse using a fixpoint according to an example embodiment of the present invention.

FIG. 11 is an illustration showing a flow chart of a method for generating a reference pulse according to an example embodiment of the present invention.

According to example embodiments, a method for generating a reference pulse using a fixpoint, such as described with reference to FIG. 10A, is provided. The reference pulse may, for example, be used one pulse, e.g., reference pulse, per revolution of the measurement object and may thus provide information indicative of the number of revolutions and the position of the measurement object. Accordingly, whenever a reference pulse is generated i.e., whenever the fixpoint is reached, the measurement object, such as a shaft, is known to be at a particular absolute position relative the detector groups.

According to example embodiments, there is provided an initiation method for setting fixpoint parameters.

Once the initiation method has been performed, the encoder, so initiated, will be able to perform a method for repeatedly generating a reference pulse so that the shaft position indicated by the reference pulse truly indicates the actual position of the shaft, despite the fact that parts of the scale device/ring 30 will "float" in relation to the shaft in dependence on temperature variations.

As the shaft rotates, the encoder will generate at least one scale gap indicator signal in dependence of the detection of a gap in the scale, as described herein. According to example embodiments, the analyzer is adapted to generate the scale gap indicator signal in response to the difference value (e) reaching a predetermined value, the predetermined value being substantially half of the gap width value. The difference value (e), according to this example embodiment, is generated by a deviation between the estimates Zest2 and Zest1.

However, the fixpoint procedure may rely on a scale gap indicator signal generated in other manners, as described herein.

The initiation method may include the following steps:

S200: Decide to use a selected one of the scale gap indicator signals that the encoder may be capable of generating.

S210: Measure or set into a memory location, an offset value FPOFFSET (see FIG. 10A), the offset value being indicative of a distance, in terms of first predetermined wavelengths $\lambda_1$, from the position of the scale device where the selected scale gap indicator signal is generated. According to example embodiments, the selected scale gap indicator signal may be generated in response to a midpoint of the gap 340, as illustrated in FIG. 10A.

S220: Identify an amplitude value FP in the signal $S_{EA1}$ as generated by the arctan function generator module 260:1 (see FIG. 10B in conjunction with FIG. 7C), at a position Z which is located at the distance of offset value FPOFFSET from the position where the scale gap indicator signal is generated.

S230: The amplitude value of the signal $S_{EA1}$ at that position FP is stored as a reference amplitude value $A_{FP}$. Since this amplitude value $A_{FP}$ is generated at a position near the fastening element F1, we can trust that the pole elements 120 (See FIGS. 3a, B, and C) near the fastening element F1 will be firmly attached to the shaft 20. Hence, that position FP of the scale device will always truly correspond to the position FP of the shaft. Moreover, the precise amplitude value $A_{FP}$ is generated only once per first predetermined wavelength $\lambda_1$ of the signal $S_{EA1}$. Hence, once a precise amplitude value $A_{FP}$ has been stored, that amplitude value $A_{FP}$ may be used to trigger a reference pulse.

Once the above initiation method has been performed, the following method may be used for generating a reference pulse.

S310: As the shaft rotates, the scale device rotates and the selected scale gap indicator signal will occur once per revolution.

S320: A distance meter is started in response to the reception of the selected scale gap indicator signal.

Although this selected scale gap indicator signal will keep occurring once per revolution, thereby being quite sufficiently accurate for indicating, e.g., the average speed of rotation of the shaft 20, the portion of the scale device 30 generating the scale gap indicator signal may not be firmly attached to the shaft. However, the position of the scale gap indicator signal is sufficiently accurate as a starting point so at to find an area $FP_A$ within half a first predetermined wavelength $\lambda_1$ from the position FP.

S330: As the shaft rotates, the distance meter provides a measure of the distance since the latest occurrence of the selected scale gap indicator signal.

S340: When the distance meter indicates the distance of about FPOFFSET from the latest occurrence of the selected scale gap indicator signal, the encoder may be adapted to compare the current value of the signal $S_{EA1}$ generated by the arctan function generator module 260:1 (see FIG. 10B in conjunction with FIG. 7C) with the stored reference amplitude value $A_{FP}$.

S350: When the current value of the signal $S_{EA1}$ equals the stored reference amplitude value $A_{FP}$, the encoder is adapted to generate a fix point reference signal.

The output signal generator of the encoder may be adapted to generate an encoder output reference signal in direct response to the fix point reference signal.

Hence, the fix point reference signal may be generated in response to the detection of a previously stored reference amplitude value $A_{FP}$. Since that particular amplitude value is unique within the distance of one first predetermined wavelength $\lambda_1$ as illustrated by FIG. 10B, and since the physical portion FP of the scale device 30 is firmly attached to the shaft by a fastener F1 (See FIG. 10A), the shaft position at which the fix point reference signal is generated will have a small degree of inaccuracy.

In a first method step S100, a distance FPOFFSET from a gap to a fixpoint position FP or the distance FPOFFSET from a gap to a position within a fixpoint region FPR is stored.

After the method step S100, a subsequent method step S110 is performed.

In the method step S110, a gap in the scale device is detected.

After the method step S110, a subsequent method step S120 is performed.

In the method step S120, it is determined when the position of the fixpoint or the position within the fixpoint regions is reached. For example, the distance FPOFFSET indicative of the distance between the gap and the fixpoint position or position within the fixpoint region is used to determine when the position of the fixpoint or the position within the fixpoint region is reached.

After the method step S120, a subsequent method step S130 is performed.

In the method step S130, an electrical angle at the fixpoint position or an electrical angle at the position within the fixpoint region is stored. For example, when the position of the fixpoint or when the position within the fixpoint region is reached by at least one of the detector groups 50:1, 50:2, one of the signal pairs A1B1 and A2B2 is processed by using the arctan function to determine the electrical angle at the fixpoint position or at the position within the fixpoint region. The electrical angle is subsequently stored in a memory device associated with the encoder system, such as a flash memory device.

After the method step S130, a subsequent method step S140 is performed.

In the method step S140, a reference pulse is generated at the position of the fixpoint or at the position within the fixpoint region.

After the method step S140, a subsequent method step S150 is performed.

In the method step S150, a gap is detected. For example, it is detected when the gap is reached at least a second time as a result of the revolutions of the measurement object.

After the method step S150, a subsequent method step S160 is performed.

In the method step S160, it is detected when a tolerance window of the fixpoint position or when a tolerance window of the position within the fixpoint region is reached. For example, it is detected when a predetermined tolerance window of the fixpoint position or when a predetermined tolerance window of the position within the fixpoint region is reached. The predetermined tolerance window may, for example, correspond to $-\lambda/2$ to $\lambda/2$ as described with reference to FIG. 10A.

After the method step S160, a subsequent method step S170 is performed.

In the method step S170, it is determined when the stored electrical angle is reached. In other words, when the electrical angle within the tolerance window corresponds to the stored electrical angle. For example, when the tolerance window is reached, it is determined when the stored electrical angle is reached by processing the arctan function of at least one of the signal pairs A1B1, A2B2, generated by the detector groups 50:1, 50:2.

After the method step S170, a subsequent method step S180 is performed.

In the method step S180, a reference pulse is generated. For example, a reference pulse is generated in response to the stored electrical angle being reached within the tolerance window.

After the method step S180, the method may end or repeat from step S150 to provide for generation of subsequent reference pulses in response to revolutions of the measurement object.

What is claimed is:

1. An encoder for detection of rotational movement of a rotatable shaft in relation to a part of a machine, comprising:
    a scale device adapted to attach to a circumference of the shaft, the scale device having a width and a length and including a first magnetic scale pattern having a plurality of magnetic pole elements provided with a first predetermined division in a direction of the length adapted to generate a first magnetic field pattern at a first distance from a surface of the scale device, the scale device including at least one gap between ends of the first magnetic scale pattern; and
    a signal generator adapted to mount on the machine part, the signal generator including:
        a housing;
        a first output terminal adapted to provide an encoder output signal indicative of a relative change in position between the signal generator and the scale device;
        a second output terminal adapted to provide a reference signal indicative of a rotational position of the shaft;
        a first magneto-electric transducer head having a first magneto-electric transducer adapted to generate a first electric signal in response to detection of the magnetic field pattern so that the first electric signal varies periodically in dependence on the first magnetic field pattern such that the variation exhibits a first wavelength that depends on the first predetermined division when the first magneto-electric transducer moves along the first magnetic scale pattern;
        a second magneto-electric transducer head having a second magneto-electric transducer adapted to generate a second electric signal in response to detection of the first magnetic field pattern so that the second electric signal varies periodically in dependence on the first magnetic field pattern such that the variation exhibits the first wavelength dependent on the first predetermined division when the second magneto-electric transducer moves along the first magnetic scale pattern;
        a first signal processing unit including:
            a first device adapted to generate a periodically varying first digital signal in dependence on the first electric signal such that the variation of the first digital signal exhibits the first wavelength when the first magneto-electric transducer moves along the first magnetic scale pattern; and a second device adapted to generate a periodically varying second digital signal in dependence on the second electric signal such that the variation of the second digital signal exhibits the first wavelength when the second magneto-electric transducer moves along the first magnetic scale pattern (35, 140);

an analyzer adapted to generate a scale gap indicator signal in dependence on detection of the gap; and an output signal producer adapted to produce the encoder output signal in dependence on the first digital signal and the second digital signal and adapted to produce the reference signal in dependence on the scale gap indicator signal.

2. The encoder according claim 1, wherein the analyzer is adapted to generate the scale gap indicator signal in dependence on an analysis involving the first digital signal, an analysis involving the second digital signal, and/or a comparative analysis involving the first digital signal and the second digital signal.

3. The encoder according claim 1, wherein the analyzer is adapted to generate the scale gap indicator signal: (a) in response to detection of a deviation between the magnetic field pattern as sensed by the first magneto-electric transducer head and the magnetic field pattern sensed by the second magneto-electric transducer head; and/or (b) in response to detection of a change in: (i) the magnetic field pattern as sensed by the first magneto-electric transducer head; or (ii) the magnetic field pattern sensed by the second magneto-electric transducer head.

4. The encoder according claim 1, wherein the analyzer is adapted to generate the scale gap indicator signal in response to detection of a change in: (a) the magnetic field pattern as sensed by the first magneto-electric transducer head by a phase error signal switching from a state indicating no phase error to a state indicating detection of a phase error; and/or (b) the magnetic field pattern as sensed by the first magneto-electric transducer head by a phase error signal switching from a state indicating a phase error to a state indicating no phase error.

5. The encoder according claim 1, wherein the analyzer is adapted to generate the scale gap indicator signal in dependence on a comparative analysis involving a first position value estimate and a second position value estimate.

6. The encoder according claim 1, the analyzer is adapted to generate a First_off_Scale signal indicating that the first magneto-electric transducer head is not in a position to detect the scale when a second position value estimate indicates a certain degree of movement and a first position value estimate indicates less movement or substantially no movement, and wherein the analyzer is adapted to generate the scale gap indicator signal in response to the First_off_Scale signal.

7. The encoder according claim 1, wherein the said analyzer is adapted to generate a value indicative of a difference in detected movement, the difference value indicating a difference between a second position value estimate and a first position value estimate.

8. The encoder according to claim 7, wherein the analyzer is adapted to generate the scale gap indicator signal in response to the difference value reaching a predetermined value.

9. The encoder according claim 7, wherein the analyzer is adapted to generate the scale gap indicator signal in response to the difference value reaching a predetermined value corresponding to a certain ratio of a gap width value.

10. The encoder according claim 7, wherein the analyzer is adapted to generate the scale gap indicator signal in response to the difference value reaching a predetermined value being substantially half of a gap width value.

11. The encoder according claim 1, wherein the first magneto-electric transducer head includes a first lagged magneto-electric transducer adapted to generate a first lagged electric signal in response to detection of the magnetic field pattern so that the first lagged electric signal varies periodically in dependence on the magnetic field pattern such that the variation exhibits the first wavelength that depends on the first predetermined division when the first lagged magneto-electric transducer moves along the magnetic scale pattern;

wherein the first lagged magneto-electric transducer is positioned in relation to the first transducer such that, in operation, the first lagged electric signal varies at a first lag in relation to the first electric signal when the shaft rotates in a clockwise rotational direction, and such that the first lagged electric signal varies at a second lag in relation to the first electric signal when the shaft rotates in a counterclockwise rotational direction, the second lag being different from the first lag;

wherein the first device is adapted to also generate a periodically varying first lagged digital signal such that, in operation, the first lagged digital signal varies at a first lag in relation to the first digital signal when the shaft rotates in a clockwise rotational direction, and such that the first lagged electric signal varies at a second lag in relation to the first electric signal when the shaft rotates in a counterclockwise rotational direction, the second lag being different from the first lag; and wherein the analyzer is adapted to generate the scale gap indicator signal in dependence on an amplitude analysis of the periodically varying first digital signal and the periodically varying first lagged digital signal in accordance with the periodically varying first digital signal and the periodically varying first lagged digital signal being substantially quadrature signals when the first magneto-electric transducer moves along a first magnetic scale pattern.

12. The encoder according to claim 11, wherein the second magneto-electric transducer head includes a second lagged magneto-electric transducer adapted to generate a second lagged electric signal in response to detection of the magnetic field pattern so that the second lagged electric signal varies periodically in dependence on the magnetic field pattern such that the variation exhibits the first wavelength that depends on the first predetermined division when the second lagged magneto-electric transducer moves along the magnetic scale pattern;

wherein the second lagged magneto-electric transducer is positioned in relation to the second transducer such that, in operation, the second lagged electric signal varies at a first lag in relation to the second electric signal when the shaft rotates in a clockwise rotational direction, and such that the second lagged electric signal varies at a second lag in relation to the second electric signal when the shaft rotates in a counterclockwise rotational direction;

wherein the second device is adapted to also generate a periodically varying second lagged digital signal such that, in operation, the second lagged digital signal varies at a first lag in relation to the second digital signal when the shaft rotates in a clockwise rotational direction, and such that the second lagged digital signal varies at a second lag in relation to the second digital signal when the shaft rotates in a counterclockwise rotational direction; and wherein the analyzer is adapted to generate the scale gap indicator signal in dependence on an amplitude analysis of the periodically varying second digital signal and the periodically varying second lagged digital signal in accordance with the periodically varying second digital signal and the periodically varying second lagged digital signal being substantially quadrature signals when the first magneto-electric transducer moves along a first magnetic scale pattern.

13. The encoder according to claim 12, wherein the analyzer is adapted to set a first amplitude reference value in dependence on a sum of a square of the periodically varying first digital signal and a square of the periodically varying first lagged digital signal;
   wherein the analyzer is adapted to set a second amplitude reference value in dependence on a sum of a square of the periodically varying second digital signal and the periodically varying second lagged digital signal; and
   wherein the analyzer is adapted to generate the scale gap indicator signal in dependence on a relation between the first amplitude reference value and the second amplitude reference value.

14. The encoder according to claim 1, further comprising an encoder user interface adapted to allow a user to select use of a selectable scale gap indicator signal;
   wherein the encoder allows for setting of an offset parameter value that is indicative of a distance from a position of the scale device where the selected scale gap indicator signal is generated to a position of the scale device that may be firmly attached to the shaft;
   wherein the encoder is adapted to identify a reference amplitude value in a signal generated by an arctan function generator module, the reference amplitude value occurring at a position located at a distance substantially corresponding to the offset parameter value from the position at which the selected scale gap indicator signal is generated; and
   wherein the encoder is adapted to store the reference amplitude value.

15. An encoder for detection of rotational movement of a rotatable shaft in relation to a part of a machine, comprising:
   a scale device adapted to attach to a circumference of the shaft, the scale device having a width and a measuring path length and including a first magnetic scale pattern having a plurality of magnetic pole elements provided with a first predetermined division in a direction of the length so as to generate a first magnetic field pattern at a first distance from a surface of the scale device, the scale device including at least one gap between ends of the first magnetic scale pattern;
   a signal generator adapted to mount on the machine part and including:
      a housing;
      a first output terminal adapted to provide an encoder output signal indicative of a relative change in position between the signal generator and the scale device;
      a first magneto-electric transducer head having a first magneto-electric transducer adapted to generate a first electric signal in response to detection of the first magnetic field pattern so that the first electric signal varies periodically in dependence on the first magnetic field pattern such that the variation exhibits a first wavelength that depends on the first predetermined division when the first magneto-electric transducer moves along the first magnetic scale pattern;
      a second magneto-electric transducer head having a second magneto-electric transducer adapted to generate a second electric signal in response to detection of the first magnetic field pattern so that the second electric signal varies periodically in dependence on the first magnetic field pattern such that the variation exhibits the first wavelength dependent on the first predetermined division when the second magneto-electric transducer moves along the first magnetic scale pattern;
      a first signal processing unit including:
         a first device adapted to generate a periodically varying first digital signal in dependence on the first electric signal such that the variation of the first digital signal exhibits the first wavelength when the first magneto-electric transducer moves along the first magnetic scale pattern; and
         a second device adapted to generate a periodically varying second digital signal in dependence on the second electric signal such that the variation of the second digital signal exhibits the first wavelength when the second magneto-electric transducer moves along the first magnetic scale pattern;
      an analyzer adapted to generate a scale gap indicator signal in dependence on detection of the gap; and
      an output signal producer adapted to produce the encoder output signal in dependence on the first digital signal, the second digital signal, and the scale gap indicator signal.

16. The encoder according claim 15, wherein the analyzer is adapted to generate the scale gap indicator signal in dependence on an analysis involving the first digital signal, an analysis involving the second digital signal, and/or a comparative analysis involving the first digital signal and the second digital signal.

17. The encoder according claim 15, wherein the analyzer is adapted to generate the scale gap indicator signal: (a) in response to detection of a deviation between the magnetic field pattern as sensed by the first magneto-electric transducer head and the magnetic field pattern sensed by the second magneto-electric transducer head; and/or (b) in response to detection of a change in: (i) the magnetic field pattern as sensed by the first magneto-electric transducer head; or (ii) the magnetic field pattern sensed by the second magneto-electric transducer head.

18. The encoder according claim 15, wherein the analyzer is adapted to generate the scale gap indicator signal in response to detection of a change in: (a) the magnetic field pattern as sensed by the first magneto-electric transducer head by a phase error signal switching from a state indicating no phase error to a state indicating detection of a phase error; and/or (b) the magnetic field pattern as sensed by the first magneto-electric transducer head by a phase error signal switching from a state indicating a phase error to a state indicating no phase error.

* * * * *